United States Patent
Logothetis et al.

[19]

[11] Patent Number: 6,099,677
[45] Date of Patent: Aug. 8, 2000

[54] METHOD OF MAKING MICROWAVE, MULTIFUNCTION MODULES USING FLUOROPOLYMER COMPOSITE SUBSTRATES

[75] Inventors: James J. Logothetis, East Stroudsburg, Pa.; Joseph McAndrew, Wharton, N.J.

[73] Assignee: Merrimac Industries, Inc., West Caldwell, N.J.

[21] Appl. No.: 09/199,675

[22] Filed: Nov. 25, 1998

Related U.S. Application Data

[60] Provisional application No. 60/074,571, Feb. 13, 1998.

[51] Int. Cl.[7] .............................. H05K 1/18; H05K 1/16; B32B 3/24
[52] U.S. Cl. .............................. 156/253; 156/52; 156/53; 156/56; 156/308.2; 174/260; 361/761; 361/762; 361/763; 361/764; 438/456; 438/455; 428/138; 428/131; 428/137; 428/901; 428/195; 428/166; 428/178; 428/421; 29/846; 29/848; 29/830; 29/855; 29/856; 29/849; 257/687; 257/724
[58] Field of Search .................... 428/138, 131, 428/137, 901, 195, 166, 178, 421; 174/260; 361/761, 762, 763, 764; 29/846, 848, 830, 855, 856, 849; 257/687, 724; 438/456, 455; 156/253, 52, 53, 56, 308.2

[56] References Cited

U.S. PATENT DOCUMENTS

| | | | |
|---|---|---|---|
| 5,046,238 | 9/1991 | Daigle et al. | 29/830 |
| 5,053,921 | 10/1991 | Nelson et al. | 361/386 |
| 5,274,912 | 1/1994 | Olenick et al. | 29/830 |
| 5,280,192 | 1/1994 | Kryzaniwsky | 257/723 |
| 5,287,619 | 2/1994 | Smith et al. | 29/852 |
| 5,309,629 | 5/1994 | Traskos et al. | 29/830 |
| 5,329,695 | 7/1994 | Traskos et al. | 29/830 |
| 5,432,677 | 7/1995 | Mowatt et al. | 361/719 |
| 5,440,805 | 8/1995 | Daigle et al. | 29/830 |
| 5,495,394 | 2/1996 | Kornfeld et al. | 361/764 |
| 5,579,207 | 11/1996 | Hayden et al. | 361/790 |
| 5,628,053 | 5/1997 | Araki et al. | 455/86 |
| 5,657,537 | 8/1997 | Saia et al. | 29/830 |
| 5,757,074 | 5/1998 | Matloubian et al. | 257/702 |

FOREIGN PATENT DOCUMENTS

| | | |
|---|---|---|
| 0 767 496 A1 | 4/1997 | European Pat. Off. . |
| 0 795 907 A1 | 9/1997 | European Pat. Off. . |

OTHER PUBLICATIONS

Light, David N., et al., "High Frequency Fluoropolymer–Based Packaging Technology", Oct. 1994, IBM, Endicott, NY, USA.

Ledain, Bernard, et al., "Innovative Multilayer Technologies For Active Phased Array Antennas," Dassault Electronique, Saint–Cloud, France.

*Primary Examiner*—William P. Watkins, III
*Attorney, Agent, or Firm*—Chadbourne & Parke LLP; Drew M. Wintringham; Francis G. Montgomery

[57] ABSTRACT

A platform is provided for the manufacture of microwave, multilayer integrated circuits and microwave, multifunction modules. The manufacturing process involves bonding fluoropolymer composite substrates into a multilayer structure using fusion bonding. The bonded multilayers, with embedded semiconductor devices, etched resistors and circuit patterns, and plated via holes form a self-contained surface mount module. Film bonding, or fusion bonding if possible, may be used to cover embedded semiconductor devices, including embedded active semiconductor devices, with one or more layers.

5 Claims, 17 Drawing Sheets

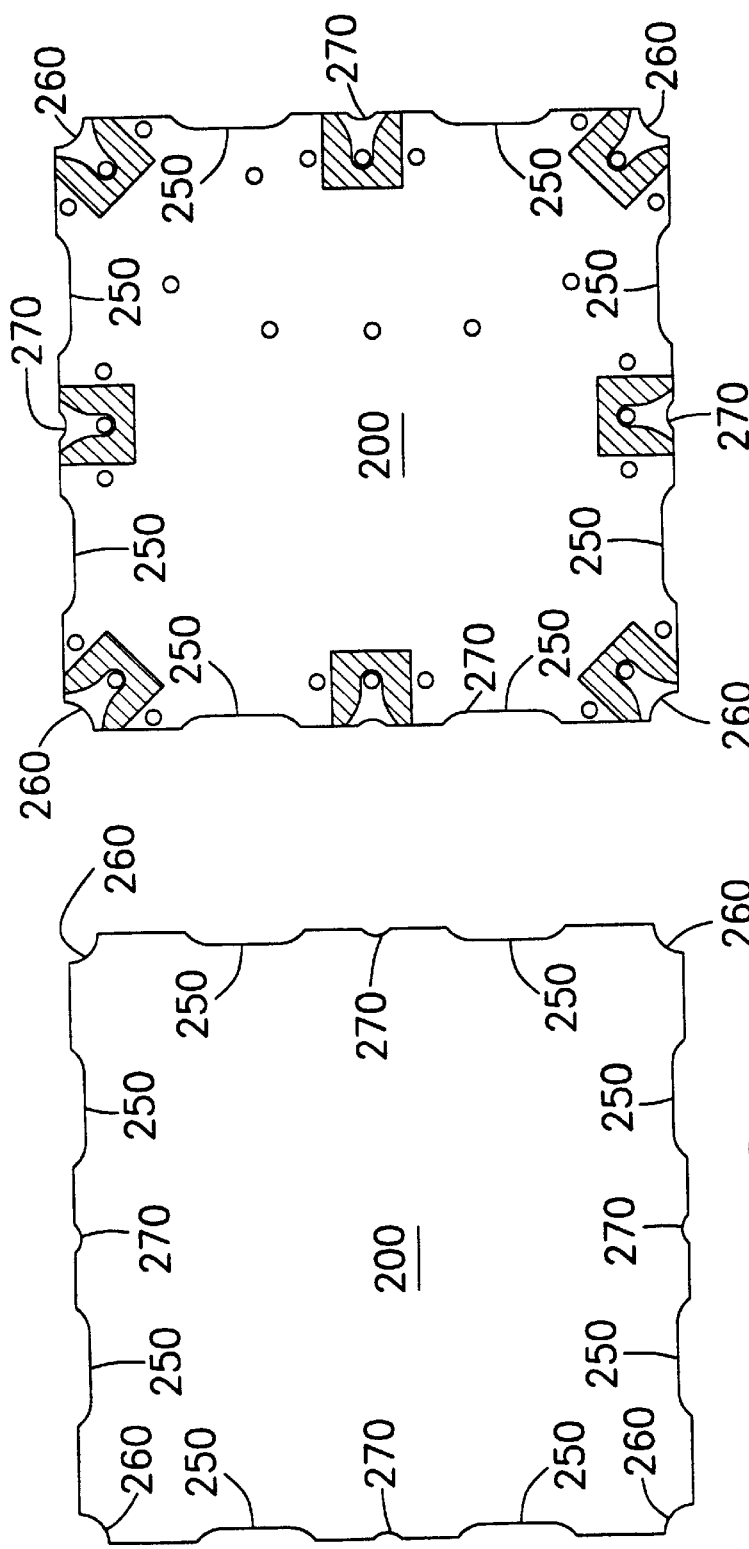
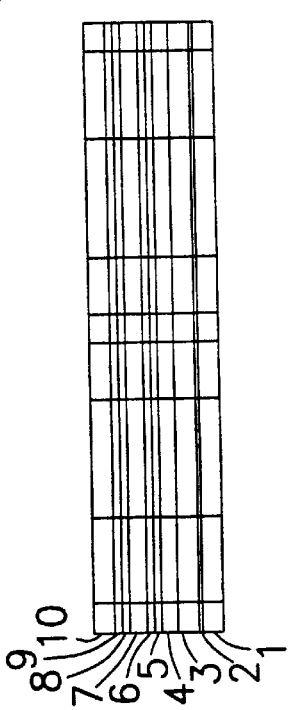
Fig. 2a
Fig. 2b
Fig. 2c

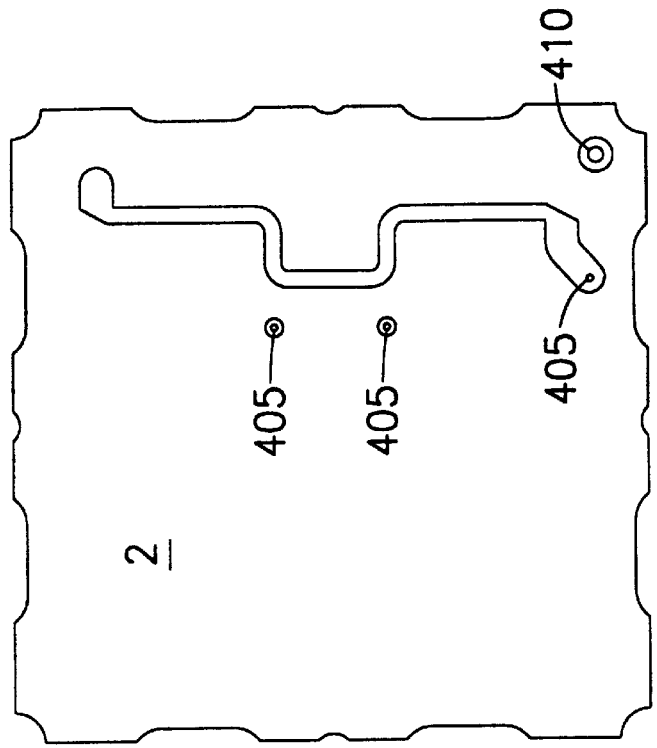
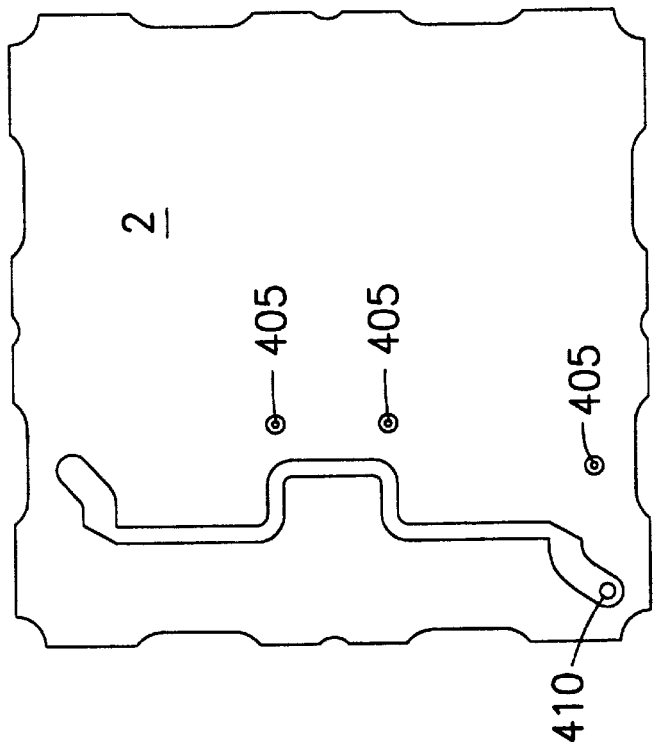
Fig. 4a
Fig. 4b
Fig. 4c

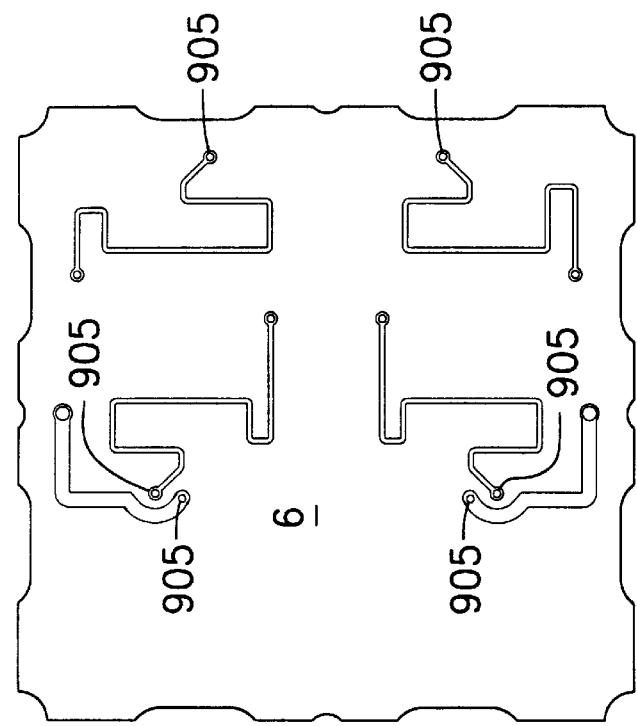
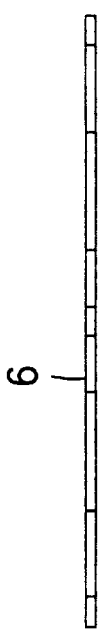
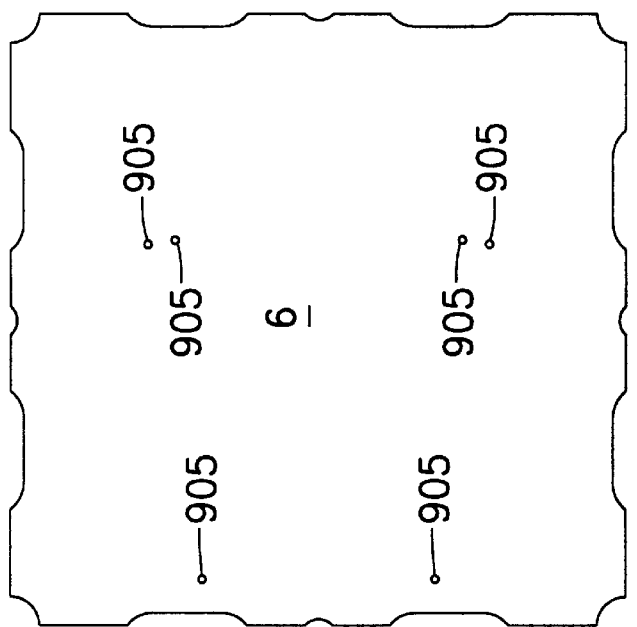
Fig. 9b
Fig. 9c
Fig. 9a

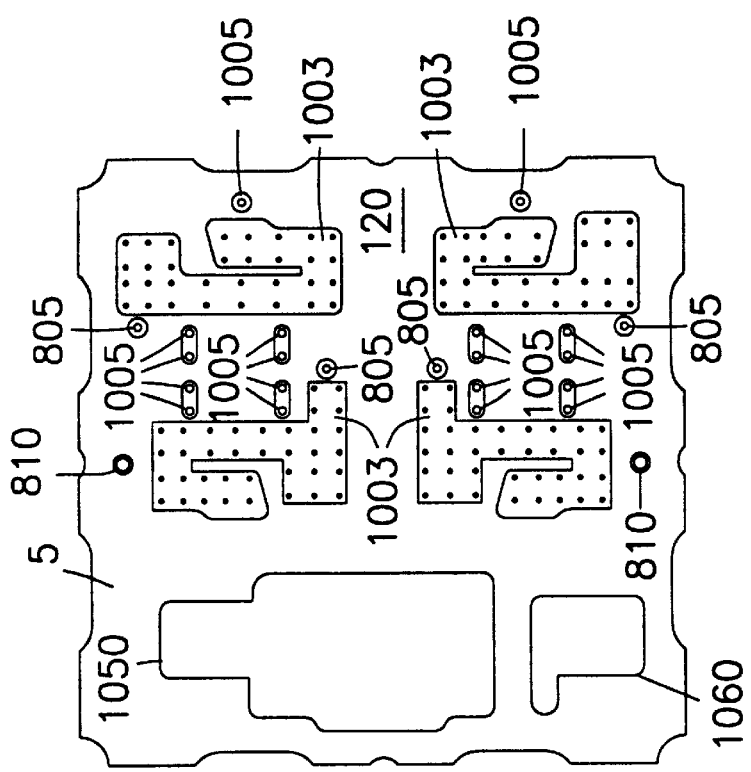
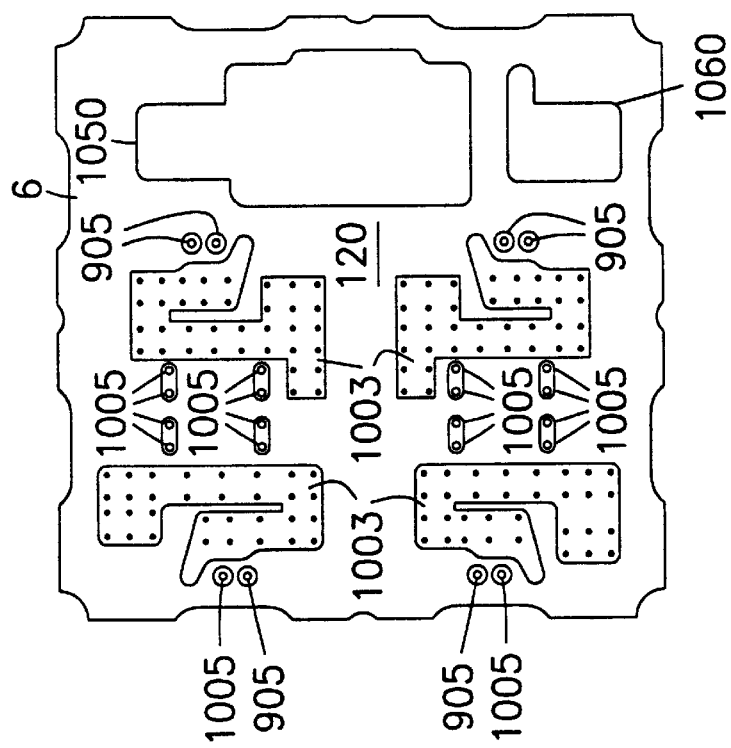
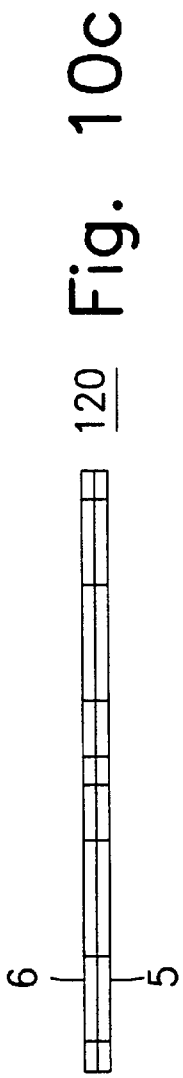
Fig. 10a
Fig. 10b
Fig. 10c

METHOD OF MAKING MICROWAVE, MULTIFUNCTION MODULES USING FLUOROPOLYMER COMPOSITE SUBSTRATES

PATENT APPLICATION

Applicants hereby claim the benefit of the earlier filing date of Provisional Patent Application No. 60/074,571 entitled "Method of Making Microwave, Multifunction Modules Using Fluoropolymer Composite Substrates," filed Feb. 13, 1998, pursuant to 35 U.S.C. § 119(e).

FIELD OF THE INVENTION

This invention relates to multilayer integrated circuits and microwave, multifunction modules. More particularly, this invention discloses a new method of manufacturing such circuits and modules by embedding semiconductor devices, including active semiconductor devices, within fluoropolymer composite substrates that are bonded together into a multilayer structure by utilizing a fusion bonding process.

BACKGROUND OF THE INVENTION

Over the decades, wireless communication systems have become more and more technologically advanced, with performance increasing in terms of smaller size, operation at higher frequencies and the accompanying increase in bandwidth, lower power consumption for a given power output, and robustness, among other factors. The trend toward better communication systems puts ever-greater demands on the manufacturers of these systems.

Today, the demands of satellite, military, and other cutting-edge digital communication systems are being met with microwave technology. In these applications, there is a need for surface-mount packaging of circuits and systems that is compact and lightweight. The demands of microwave signal processing also require a careful choice of materials to match the thermal expansion properties between mating assemblies and minimization of solder joint where possible to improve reliability. Meanwhile, factors such as size and manufacturability necessitate higher levels of integration and the reduction of discrete components in order to lower engineering costs and reduce product design cycle time.

Microwave circuits may be categorized by the material used for construction. For example, popular technologies include low temperature co-fired ceramic (LTCC), ceramic/polyamide (CP), epoxy fiberglass (FR4), fluoropolymer composites (PTFE), and mixed dielectric (MDk, a combination of FR4 and PTFE). Each technology has its strengths and addresses one or several of the issues set forth above, but no current technology addresses all of the issues.

For example, multilayer printed circuit boards using FR4, PTFE, or MDk technologies are often used to route signals to components that are mounted on the surface by way of soldered connections of conductive polymers. For these circuits, resistors can be screen-printed or etched, and may be buried. These technologies can form multifunction modules (MCM) which carry monolithic microwave integrated circuits (MMICs) and can be mounted on a motherboard.

Although FR4 has low costs associated with it and is easy to machine, it is typically not suited for microwave frequencies, due to a high loss tangent and a high correlation between the material's dielectric constant and temperature. There is also a tendency to have coefficient of thermal expansion (CTE) differentials that cause mismatches in an assembly. Even though recent developments in FR4 boards have improved electrical properties, the thermoset films used to bond the layers may limit the types of via hole connections between layers.

PTFE is a better technology than FR4 for most microwave applications. Composites having glass and ceramic often have exceptional thermal stability. Furthermore, complex microwave circuits can be fabricated using PTFE technology and the application of fusion bonding allows homogeneous multilayer assemblies to be formed. However, present methods utilizing this technology result in devices being exposed on the surfaces of these multifunction modules. Additionally, design cycle time tends to be long and involve large costs.

Another popular technology is CP, which involves the application of very thin layers of polyamide dielectric and gold metalization onto a ceramic bottom layer containing MMICs. This technology may produce circuitry an order of magnitude smaller than FR4, PTFE, or MDk, and usually works quite well at high microwave frequencies. Semiconductors may be covered with a layer of polyamide. However, as with PTFE technology, design cycles are usually relatively long and costly. Also, CTE differentials often cause mismatches with some mating assemblies.

Finally, LTCC technology, which forms multilayer structures by combining layers of ceramic and gold metalization, also works well at high microwave frequencies. Additionally, cavities can be easily formed, to allow devices to be enclosed therein, and covered with a layer of ceramic. However, as with CP technology, design cycles are usually relatively long and costly, and CTE differentials often cause mismatches with some mating assemblies.

SUMMARY OF THE INVENTION

The present invention relates to a process or method of manufacturing multilayer integrated circuits and microwave, multifunction modules by utilizing fluoropolymer composite substrates, which are bonded together into a multilayer structure by utilizing a fusion bonding process. The composite substrate material comprises polytetrafluoroethylene (PTFE) filled with glass fibers and ceramic. Cutouts may be milled in individual substrate layers to make room for semiconductor devices. A polymer bonding film layer may be used to bond an additional substrate layer or layers to cover semiconductor devices embedded within the structure. Preferably, via holes, which may have various shapes such as circular, slot, and/or elliptical by way of example, are used to connect the circuitry of the layers.

It is an object of this invention to provide a low-cost manufacturing process suitable for high volume production and for low volume production.

It is another object of this invention to provide multifunction modules with embedded semiconductor devices, including active semiconductor devices, using a fluoropolymer composite substrates material having a low dielectric loss tangent for microwave signals.

It is another object of this invention to provide multifunction modules with embedded semiconductor devices, including active semiconductor devices, wherein the embedded semiconductor devices are protected by one or more cover layers.

It is another object of this invention to provide multifunction modules with embedded semiconductor devices, including active semiconductor devices, using a fluoropolymer composite substrates material having a large range of possible dielectic constant values.

It is another object of this invention to provide multifunction modules with embedded semiconductor devices, including active semiconductor devices, using a fluoropolymer composite substrates material having a small CTE value that substantially matches the CTE value of copper and aluminum.

It is another object of this invention to provide multifunction modules with embedded semiconductor devices, including active semiconductor devices, having minimal stress due to unequal CTE in the bond region.

It is another object of this invention to provide multifunction modules with embedded semiconductor devices, including active semiconductor devices, having plated via holes with improved reliability of performance passing through bond regions.

It is another object of this invention to provide multifunction modules with embedded semiconductor devices, including active semiconductor devices, wherein connections between circuit patterns and resistors are continuous, thereby providing interconnections that are substantially more reliable than solder joints.

It is another object of this invention to provide multifunction modules with embedded semiconductor devices, including active semiconductor devices, with reduced interconnection path lengths, thereby providing lower insertion loss for passive components.

It is another object of this invention to provide multifunction modules utilizing a polymer film bonding process to bond layers and protect semiconductor devices, including active semiconductor devices, embedded in cavities formed within particular layers.

It is another object of this invention to provide a multifunction module structure with embedded semiconductor devices, including active semiconductor devices, that has a small outline.

It is another object of this invention to provide a multifunction module structure with embedded semiconductor devices, including active semiconductor devices, that has a low profile.

It is another object of this invention to provide a multifunction module structure with embedded semiconductor devices, including active semiconductor devices, that is lightweight.

It is another object of this invention to provide a multifunction module structure with embedded semiconductor devices, including active semiconductor devices, with a surface-mount format that is compatible with microstrip or coplanar waveguides.

It is another object of this invention to provide a platform method of module architecture design that is an adaptable multilayer design approach to creating application-specific integrated circuits.

It is another object of this invention to provide a platform method of module architecture design that lends itself to a product design cycle time that is shorter than for other methods of module architecture design.

It is another object of this invention to provide a fusion process for substrate layers with embedded semiconductor devices, including active semiconductor devices, that creates a homogeneous dielectric medium for improved electrical performance at microwave frequencies.

BRIEF DESCRIPTION OF THE DRAWINGS

Some of the following figures depict circuit patterns, including copper etchings and holes, on substrate layers. Although certain structures, such as holes, may be enlarged to show clarity, these figures are drawn to be accurate as to the shape and relative placement of the various structures for a preferred embodiment of the invention.

FIG. 2a is a top view of a final assembly of a ten-layered microwave, multilayer integrated circuit created by the process outlined in the flow chart of FIG. 1.

FIG. 2b is a bottom view of a final assembly of a ten-layered microwave, multilayer integrated circuit created by the process outlined in the flow chart of FIG. 1.

FIG. 2c is a side view of a final assembly of a ten-layered microwave, multilayer integrated circuit created by the process outlined in the flow chart of FIG. 1.

FIG. 4a is a top view of the unfinished second layer of a ten-layered microwave, multilayer integrated circuit shown in FIG. 2.

FIG. 4b is a bottom view of the unfinished second layer of a ten-layered microwave, multilayer integrated circuit shown in FIG. 2.

FIG. 4c is a side view of the unfinished second layer of a ten-layered microwave, multilayer integrated circuit shown in FIG. 2.

FIG. 9a is a top view of the unfinished sixth layer of a ten-layered microwave, multilayer integrated circuit shown in FIG. 2.

FIG. 9b is a bottom view of the unfinished sixth layer of a ten-layered microwave, multilayer integrated circuit shown in FIG. 2.

FIG. 9c is a side view of the unfinished sixth layer of a ten-layered microwave, multilayer integrated circuit shown in FIG. 2.

FIG. 10a is a top view of a first two-layered subassembly of a ten-layered microwave, multilayer integrated circuit shown in FIG. 2.

FIG. 10b is a bottom view of a first two-layered subassembly of a ten-layered microwave, multilayer integrated circuit shown in FIG. 2.

FIG. 10c is a side view of a first two-layered subassembly of a ten-layered microwave, multilayer integrated circuit shown in FIG. 2.

DETAILED DESCRIPTION OF THE INVENTION

I. The Substrate Layers

Figure 1:
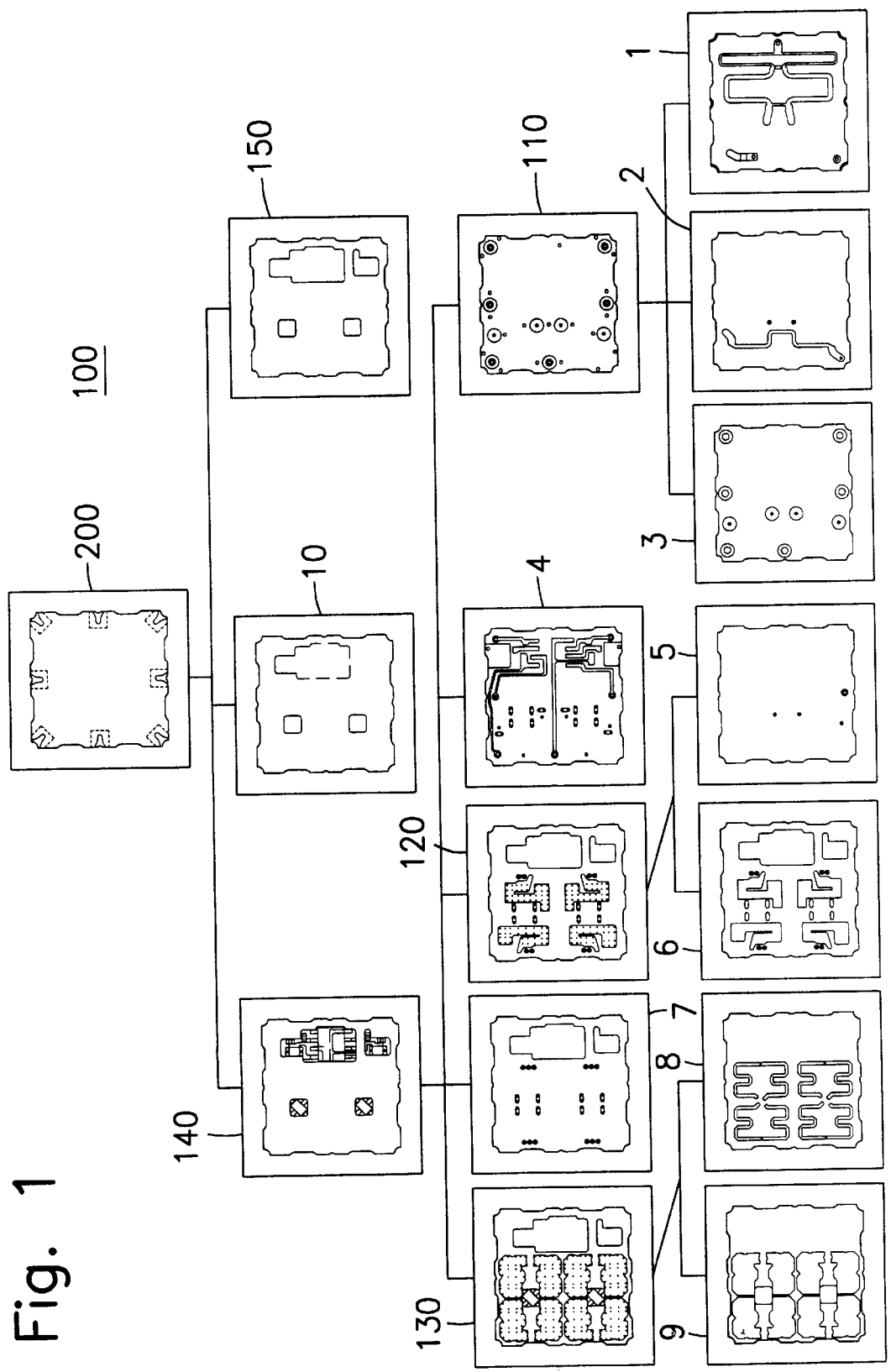
FIG. 1 is a flow chart showing an overview of the building of subassemblies and a final assembly for a preferred embodiment of the invention having ten layers.

The multilayered structure described herein comprises a stack of substrate layers. A substrate "layer" is defined as a substrate including circuitry on one or both sides. A layer may have semiconductor devices, such as diodes, embedded within.

The stack of substrate layers is bonded to form a multilayer structure. A multilayer structure may have a few or many layers. In a preferred embodiment described below, a ten-layered multilayer structure is disclosed.

In a preferred embodiment, a substrate is approximately 0.005 inches to 0.030 inches thick and is a composite of polytetrafluoroethylene (PTFE), glass, and ceramic. Often, much thicker substrates are possible, but result in physically larger circuits, which are undesirable in many applications. It is known to those of ordinary skill in the art of multilayered circuits that PTFE is a preferred material for fusion bonding while glass and ceramic are added to alter the dielectric constant and to add stability. Substitute materials may become commercially available. Thicker substrates are possible, but result in physically larger circuits, which are undesirable in many applications. Preferably, the substrate composite material has a CTE that is close to that of copper, such as from approximately 7 parts per million per degree C to approximately 27 parts per million per degree C. Preferably, the substrate composite material has dielectric loss tangents from approximately 0.0013 to approximately 0.0024 for microwave signals.

Although these layers may have a wide range of dielectric constants such as from approximately 1 to approximately 100, at present substrates having desirable characteristics are commercially available with typical dielectric constants of approximately 2.9 to approximately 10.2.

II. The Fusion Bonding Process

A preferable method for bonding PTFE composite substrate layers is fusion bonding. The fusion bonding process provides a homogeneous structure that has superior electrical performance at microwave frequencies. For example, fusion bonding substantially reduces stress due to CTE differentials in the bond region and improves the reliability of plated via holes passing through the bond region.

Fusion bonding is typically accomplished in an autoclave or hydraulic press by heating substrate layers past the PTFE composite melting point while simultaneously applying a predetermined amount of pressure, preferably mechanically, isostatically, or a combination of both. The alignment of layers is typically secured by a precision fixture with a plurality of pins, preferably three to eight but possibly more, to stabilize flow as the PTFE resin changes state to a viscous liquid and adjacent layers fuse under pressure. The pin configuration is preferably triangular or rectangular, depending on the application and the size of the stack being bonded. The pins themselves are preferably round, square, rectangular, oval, or diamond-shaped, but may have other shapes in other embodiments.

Although bonding pressure typically varies from approximately 100 PSI to approximately 1000 PSI and bonding temperature typically varies from approximately 350 degrees C to 450 degrees C, an example of a profile is 200 PSI, with a 40 minute ramp from room temperature to 240 degrees C, a 45 minute ramp to 375 degrees C, a 15 minutes dwell at 375 degrees C, and a 90 minute ramp to 35 degrees C.

III. Formation of Slots, Cavities and Holes

Layers and subassemblies consisting of a plurality of layers are preferably made in arrays on large substrate panels, typically 9 inches by 12 inches or 18 inches by 24 inches. The alignment of substrate panels is typically secured by a precision fixture with a plurality of pins, preferably three to eight but possibly more, on a router table.

The pin configuration is preferably triangular or rectangular, depending on the application and the size of the stack. The pins themselves are preferably round, square, rectangular, oval, or diamond-shaped, but may have other shapes in other embodiments.

Cavities, or spotface patterns, preferably conform to the shapes of devices to be embedded within them, to minimize cavity size. Slots are preferably made in assemblies or subassemblies. In a preferred embodiment, slots are formed by drilling two elliptical holes joined together by flats, which are 0.04 inches long in a preferred embodiment, and subsequently clearing the edges with an endmill. Through holes, or via holes, are drilled in a preferred embodiment, but may be plasma-etched. Edges or corners of subassemblies or assemblies (or in certain embodiments, individual layers) are also cleared preferably by drilling and/or milling.

For most applications, the speeds, feeds and number of hits of the drill(s), as well as the total linear distances drilled, are critical parameters to monitor during the drilling/milling process. The wear on the tools contributes to smearing of the fluoropolymer composite, and may also affect the plating process. In a preferred embodiment, carbide drill bits and endmills are utilized, although standard high-speed steel can be used in an alternative embodiment. In a preferred embodiment, drill speeds range approximately 30,000 to 150,000 RPM, while endmill speeds range approximately 25,000 to 75,000 RPM. Feed rates for these tools range between 20 and 50 inches per minute. For a typical drill bit, drill hits range approximately 200 to 800, and linear distance of routed board range approximately 25 to 100 inches. A common schedule would be to drill at 50,000 RPM for a maximum of 250 hits, and to rout at 35,000 RPM for a maximum of 50 linear inches. Preferably, tools are changed when the maximum number of hits and linear distance are reached.

IV. Plating of Slots, Cavities, and Holes

A preferable method of plating surfaces of slots, cavities, and holes involves activating the surface with a sodium etchant (or, in an alternative embodiment, with plasma), followed by cleaning the substrate by rinsing in alcohol for 15 to 30 minutes, then preferably rinsing in water, preferably deionized, having a temperature of 70 to 125 degrees F for at least 15 minutes. The substrate is then vacuum baked for approximately 30 minutes to 2 hours at approximately 90 to 180 degrees C, but preferably for one hour at 149 degrees C, to remove moisture. The substrate is then plated with copper, preferably first using an electroless copper seed layer followed by an electrolytic copper plate, preferably to a thickness of approximately 0.0005 to 0.0010 inches. The substrate is preferably then rinsed in water, preferably deionized, for at least one minute.

V. Attachment of Semiconductor Devices

Preferably, semiconductor devices, for example diodes, amplifiers, transistors, and other active devices, may be embedded in cavities formed in particular substrate layers. These devices may be, for example, unpackaged dice, or packaged in surface mount, beam lead, chip-scale, flip-chip, and/or BGA. In a preferred embodiment the devices are attached with pneumatically or manually dispensed solder paste; in other preferred embodiments conductive polymer, wire bonds, or welding may be used for attachment. The devices are placed by hand or by machine, such as automated SMT pick and place equipment.

VI. Film Bonding

Although fusion bonding is usually preferable to film bonding, there are certain instances where film bonding is used. For example, certain devices embedded within substrate cavities are not able to withstand the heat and/or pressure of the fusion bonding process. It is often advantageous to bond at least one cover layer onto a subassembly having embedded devices using the polymer film bonding process described below. The cover layer or layers protect the devices from the environment and may eliminate the need for additional packaging. Inspection of the placed devices is usually performed before film bonding the cover layer or layers by using manual vision systems, automated vision systems, or X-ray systems.

Preferably, a bonding film having a thickness of approximately 0.0010 to 0.0025 inches, but preferably 0.0015 inches, is utilized. Typically, a thermoset or thermoplastic polymer film is machined to form clearances for attached devices, via holes, and cavities. Film bonding is typically accomplished in an autoclave or hydraulic press by heating a subassembly containing substrate layers sandwiching the bonding film past the bonding film melting point while simultaneously applying a predetermined amount of pressure, preferably mechanically, isostatically, or a combination of both. The alignment of layers and bonding film is typically secured by a precision fixture with a plurality of pins, preferably three to eight but possibly more.

Although bonding pressure and temperature may vary, an example of a curing profile for thermoset polymer films is 200 PSI, with a 30 minute ramp from room temperature to 180 degrees C, a 95 minute dwell at 180 degrees C, a 30 minute ramp to 245 degrees C, a 120 minute dwell at 245 degrees C, and a 60 minute ramp to 35 degrees C. An example of a curing profile for thermoplastic polymer films is 200 PSI, with a 30 minute ramp from room temperature to 150 degrees C, a 50 minute dwell at 150 degrees C, and a 30 minute ramp to 35 degrees C.

VII. Mask Alignment and Exposure

Generally, mask files are generated in accordance with a platform strategy by CAD software. In a preferred embodiment, targets are digitized for alignment and then drilled and pinned, although cross-hairs may be used in an alternative preferred embodiment. The substrate layer is heated to a temperature of approximately 90 to 125 degrees C for approximately 5 to 30 minutes, but preferably 90 degrees C for 5 minutes, and then laminated with photoresist. Masks are aligned over substrate panels using the targets (or cross-hairs) and alignment pins, and the photoresist is exposed to light using the proper exposure settings to form circuit patters under the resist areas that remain.

VIII. Copper Etching

Typically, the procedure used in copper etching involves etching circuit patterns into an interstitial layer of copper foil. Preferably, line widths and gaps that may be as small as approximately 0.0030 inches are etched onto copper that is approximately 0.0007 inches thick (also referred to as ½ ounce copper). Smaller geometries, such as approximately 0.0010 inches, may be etched onto thinner layers of copper, such as ¼ ounce copper. In a preferred embodiment, copper etching is accomplished by applying a strong alkaline or acid to remove copper on a substrate layer or subassembly. The substrate layer or subassembly is cleaned by rinsing in alcohol for 15 to 30 minutes, then preferably rinsing in water, preferably deionized, having a temperature of 70 to 125 degrees F for at least 15 minutes. The substrate layer or subassembly is then vacuum baked for approximately 30 minutes to 2 hours at approximately 90 to 180 degrees C, but preferably for one hour at 149 degrees C, to remove moisture.

IX. Etching of Resistors

In a preferred embodiment, resistors are etched into thin nickel phosphate films adjacent to copper layers, using a method that is similar to copper etching. Typically, a circuit is copper etched before applying a second mask and applying alkaline ammonium. In a preferred embodiment, the copper above each resistor is slowly etched until the surface of the nickel is reached.

X. Method of Depaneling

When assemblies of bonded layers are manufactured in arrays as described above, they must be removed from the substrate panels. The drilling and milling procedures described above are typically used for depaneling arrays, although in alternative preferred embodiments diamond saws and EXCIMER lasers may be used.

The alignment of assemblies is typically secured by a precision fixture with a plurality of pins, preferably three to eight but possibly more, on a router table. The pin configuration is preferably triangular or rectangular, depending on the application and the size of the stack. The pins themselves are preferably round, square, rectangular, oval, or diamond-shaped, but may have other shapes in other embodiments. Typically, a combination of drilling and milling is used to create the final outline of the assemblies, which are then separated from their panels and removed to a storage tray.

Again, the speeds, feeds and number of hits of the drill(s), as well as the total linear distances drilled, are critical parameters to monitor during the drilling/milling process. The wear on the tools contributes to smearing of the fluoropolymer composite, and may also affect the plating process. In a preferred embodiment, drill speeds range approximately 30,000 to 150,000 RPM, while endmill speeds range approximately 25,000 to 75,000 RPM. Feed rates for these tools range between 20 and 50 inches per minute. For a typical drill bit, drill hits range approximately 200 to 800, and linear distance of routed board range approximately 25 to 100 inches. A common schedule would be to drill at 50,000 RPM for a maximum of 250 hits, and to rout at 35,000 RPM for a maximum of 50 linear inches. Preferably, tools are changed when the maximum number of hits and linear distance are reached.

XI. Platform Design

In a preferred embodiment, a platform strategy of module architecture design is used to provide commonized outlines and interconnection paths between functional groups of interchangeable layers. Thus, once a sufficiently large module library is created, the design time for subsequent circuits incorporating those modules is substantially reduced.

In a preferred embodiment, the platform design strategy is accomplished through three dimensional CAD drawing documentation and programmable process steps. Functional layer blocks or modules from a pre-designed library may be mixed and matched to build circuits meeting specific applications. New functional blocks may be designed by overlaying a three dimensional structural template that is common for each outline. In a preferred embodiment, process steps are automatically configured and overlaid onto new designs based on the number of layers in a desired assembly.

XII. Example of an Application of the Manufacturing Process

Referring to FIG. 1, flow chart 100 shows a broad overview of the procedure used to combine layers 1, 2, 3, 4, 5, 6, 7, 8, 9, 10, each having, in a preferred embodiment, side dimensions of 0.800 inches square, to form final assembly or multilayer structure 200.

As a quick overview of a procedure described in greater detail below, flow chart 100 shows the following. Layers 1, 2, 3 are manufactured and then bonded to form subassembly 110. Layers 5, 6 are manufactured and then bonded to form subassembly 120. Layers 8, 9 manufactured and then are bonded to form subassembly 130. Subassembly 110, layer 4, subassembly 120, layer 7, and subassembly 130 are manufactured and then bonded to form subassembly 140. Subassembly 140 and layer 10 are bonded using bonding film 150 to form multilayer structure 200, shown in FIG. 2.

In a preferred embodiment, the bonding process used to bond layers (or individual layers to subassemblies) to form subassemblies is the fusion bonding process described above.

In a preferred embodiment described below, the substrates of layers 1, 3, 10 have a thickness of approximately 0.030 inches, the substrates of layers 4, 7 have a thickness of approximately 0.020 inches, the substrates of layers 5, 6, 8, 9 have a thickness of approximately 0.010 inches, and the substrate of layer 2 has a thickness of approximately 0.005 inches. Circuits are typically formed by metalizing substrates with copper, which is typically 0.0002 to 0.0100 inches thick and is preferably approximately 0.0005 to 0.0025 inches thick, and the copper may be plated, for example, with tin or with a nickel/gold or tin/lead combination. These circuits are connected with via holes, preferably copper-plated, which are typically 0.005 to 0.125 inches in diameter, and preferably approximately 0.008 to 0.019 inches in diameter.

The following is a step-by-step description of the process used to manufacture multilayer structure 200. It is to be appreciated that the numbers used (by way of example only, dimensions, temperatures, time) are approximations and may be varied, and it is obvious to one of ordinary skill in the art that certain steps may be performed in different order.

It is also to be appreciated that the figures show the outline of substrate layers as they appear after completion of all the steps applied. Thus, some of the figures show corner holes and slots in the edges of the substrate layers that do not exist until all the layers are bonded together and slots 250 are milled and corner holes 260 and edge holes 270 are drilled in multilayer structure 200 as shown in FIG. 2.

a. Subassembly 110

Figure 3A:
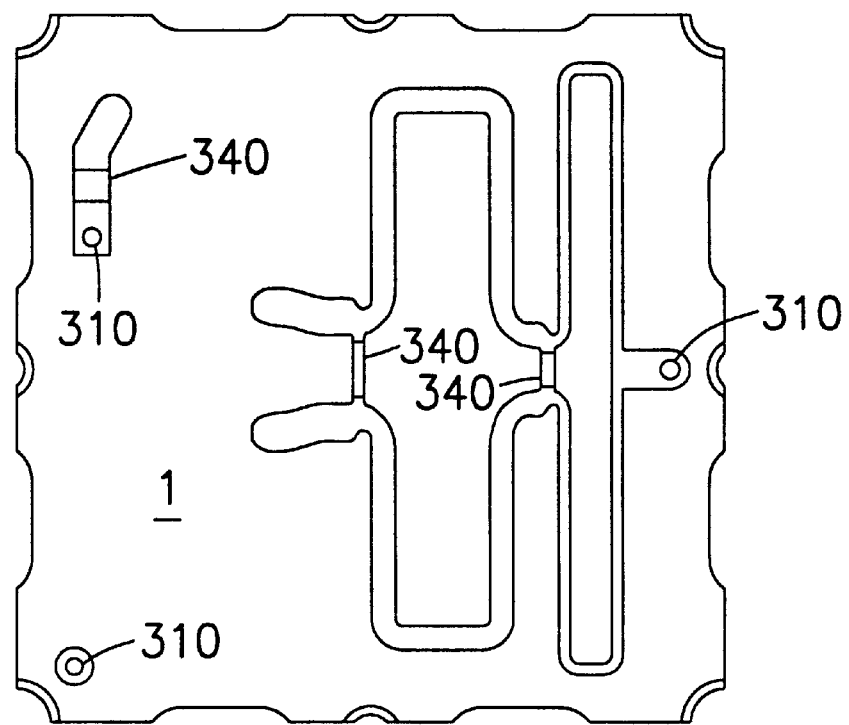
FIG. 3a is a top view of the unfinished first layer of a ten-layered microwave, multilayer integrated circuit shown in FIG. 2.
Figure 3B:
FIG. 3b is a side view of the unfinished first layer of a ten-layered microwave, multilayer integrated circuit shown in FIG. 2.

With reference to FIG. 3, a preferred embodiment of layer 1 is shown. First, three holes 310 having diameters of approximately 0.019 inches are drilled into layer 1, as shown in FIG. 3a. Next, layer 1 is sodium etched, resulting in the etching of three resistors 340. The procedure used in sodium-etching a PTFE-based substrate to be plated with copper is well known to those with ordinary skill in the art of plating PTFE substrates. Next, layer 1 is cleaned by rinsing in alcohol for 15 to 30 minutes, then preferably rinsing in water, preferably deionized, having a temperature of 70 to 125 degrees F for at least 15 minutes. Layer 1 is then vacuum baked for approximately 30 minutes to 2 hours at approximately 90 to 180 degrees C, but preferably for one hour at 149 degrees C. Layer 1 is plated with copper, preferably first using an electroless method followed by an electrolytic method, to a thickness of approximately 0.0005 to 0.001 inches. Layer 1 is preferably rinsed in water, preferably deionized, for at least 1 minute. Layer 1 is heated to a temperature of approximately 90 to 125 degrees C for approximately 5 to 30 minutes, but preferably 90 degrees C for 5 minutes, and then laminated with photoresist. A mask is used and the photoresist is developed using the proper exposure settings to create the pattern shown in FIG. 3a. The top side of layer 1 is copper etched. Layer 1 is cleaned by rinsing in alcohol for 15 to 30 minutes, then preferably rinsing in water, preferably deionized, having a temperature of 70 to 125 degrees F for at least 15 minutes. Layer 1 is then vacuum baked for approximately 30 minutes to 2 hours at approximately 90 to 180 degrees C, but preferably for one hour at 149 degrees C.

With reference to FIG. 4, a preferred embodiment of layer 2 is shown. First, three holes 405 having diameters of approximately 0.010 inches and hole 310 having a diameter of approximately 0.019 inches are drilled into layer 2, as shown in FIGS. 4a and 4b. Next, layer 2 is sodium etched. Layer 2 is cleaned by rinsing in alcohol for 15 to 30 minutes, then preferably rinsing in water, preferably deionized, having a temperature of 70 to 125 degrees F for at least 15 minutes. Layer 2 is then vacuum baked for approximately 30 minutes to 2 hours at approximately 90 to 180 degrees C, but preferably for one hour at 149 degrees C. Layer 2 is plated with copper, preferably first using an electroless method followed by an electrolytic method, to a thickness of approximately 0.0005 to 0.001 inches. Layer 2 is preferably rinsed in water, preferably deionized, for at least 1 minute. Layer 2 is heated to a temperature of approximately 90 to 125 degrees C for approximately 5 to 30 minutes, but preferably 90 degrees C for 5 minutes, and then laminated with photoresist. A mask is used and the photoresist is developed using the proper exposure settings to create the patterns in FIGS. 4a and 4b. Both the top side and bottom side of layer 2 are copper etched. Layer 2 is cleaned by rinsing in alcohol for 15 to 30 minutes, then preferably rinsing in water, preferably deionized, having a temperature of 70 to 125 degrees F for at least 15 minutes. Layer 2 is then vacuum baked for approximately 30 minutes to 2 hours at approximately 90 to 180 degrees C, but preferably for one hour at 149 degrees C.

Figure 5B:
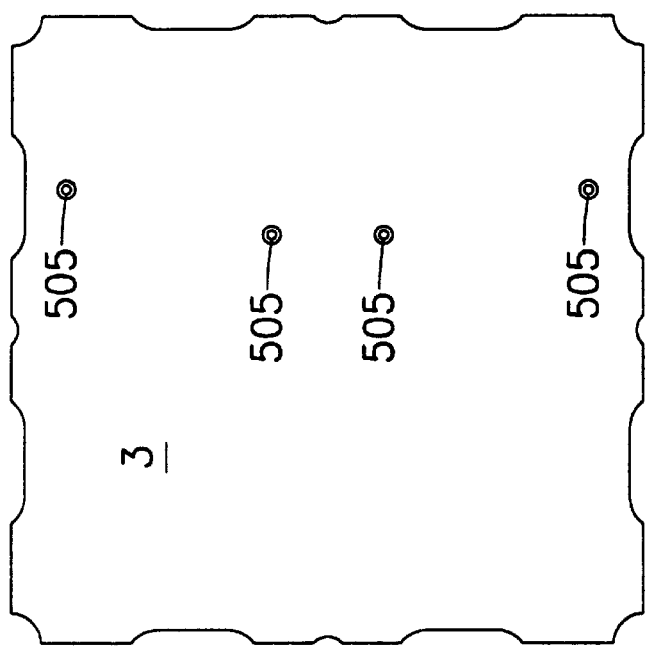
FIG. 5b is a bottom view of the unfinished third layer of a ten-layered microwave, multilayer integrated circuit shown in FIG. 2.
Figure 5C:
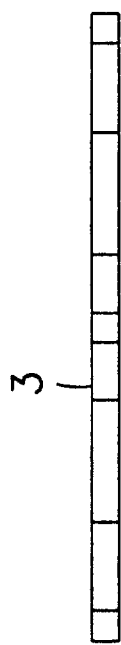
FIG. 5c is a side view of the unfinished third layer of a ten-layered microwave, multilayer integrated circuit shown in FIG. 2.
Figure 5A:
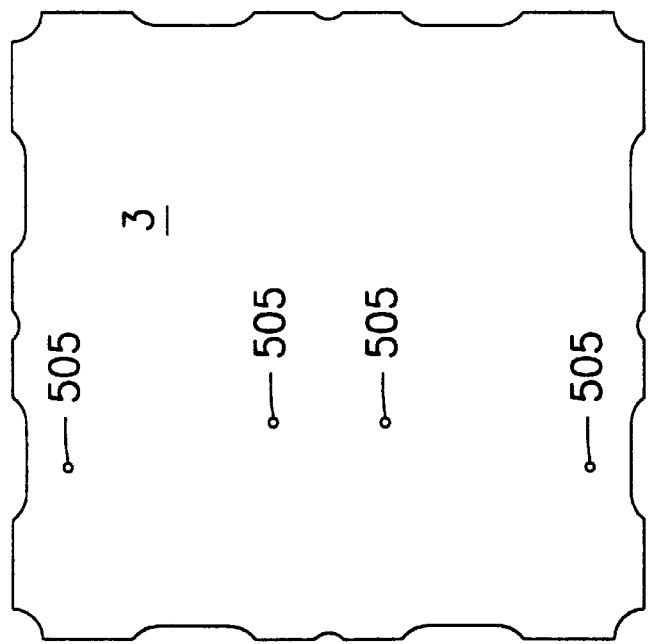
FIG. 5a is a top view of the unfinished third layer of a ten-layered microwave, multilayer integrated circuit shown in FIG. 2.

With reference to FIG. 5, a preferred embodiment of layer 3 is shown. First, four holes 505 having diameters of approximately 0.010 inches are drilled into layer 3, as shown in FIGS. 5a and 5b. Next, layer 3 is sodium etched. Layer 3 is cleaned by rinsing in alcohol for 15 to 30 minutes, then preferably rinsing in water, preferably deionized, having a temperature of 70 to 125 degrees F for at least 15 minutes. Layer 3 is then vacuum baked for approximately 30 minutes to 2 hours at approximately 90 to 180 degrees C, but preferably for one hour at 149 degrees C. Layer 3 is plated with copper, preferably first using an electroless method followed by an electrolytic method, to a thickness of approximately 0.0005 to 0.001 inches. Layer 3 is preferably rinsed in water, preferably deionized, for at least 1 minute. Layer 3 is heated to a temperature of approximately 90 to 125 degrees C for approximately 5 to 30 minutes, but preferably 90 degrees C for 5 minutes, and then laminated with photoresist. A mask is used and the photoresist is developed using the proper exposure settings to create the pattern shown in FIG. 5b. The bottom side of layer 3 is copper etched. Layer 3 is cleaned by rinsing in alcohol for 15 to 30 minutes, then preferably rinsing in water, preferably deionized, having a temperature of 70 to 125 degrees F for at least 15 minutes. Layer 3 is then vacuum baked for approximately 30 minutes to 2 hours at approximately 90 to 180 degrees C, but preferably for one hour at 149 degrees C.

Figure 6A:
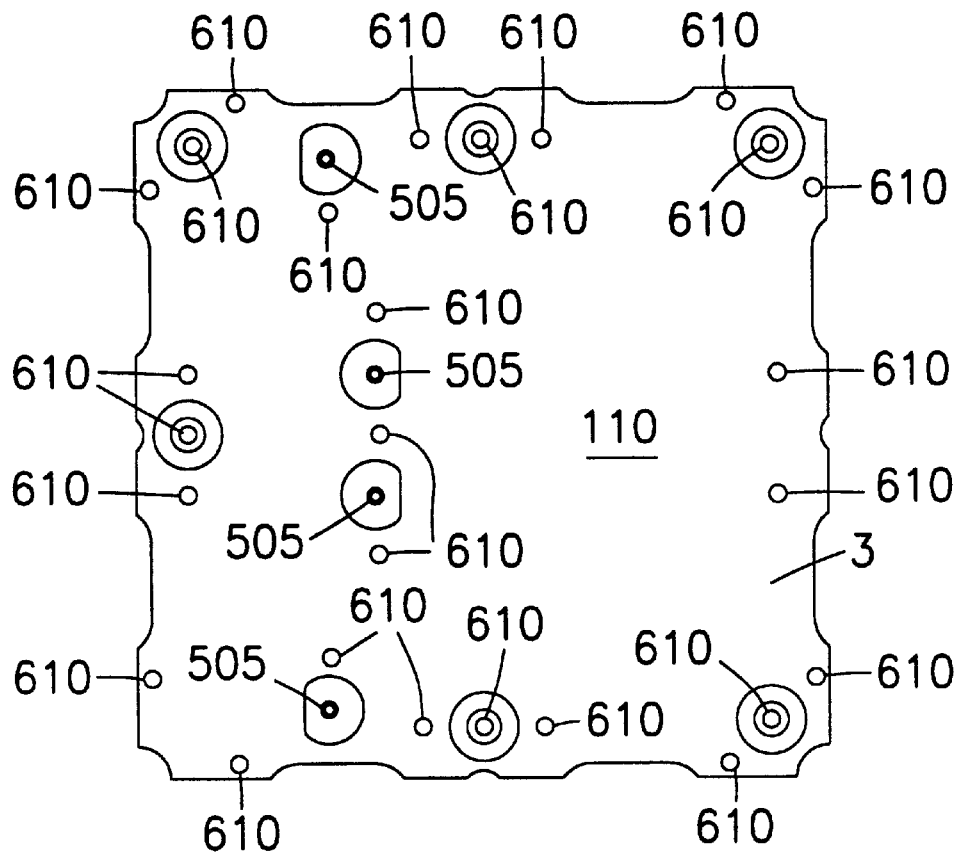
FIG. 6a is a top view of a three-layered subassembly of a ten-layered microwave, multilayer integrated circuit shown in FIG. 2.
Figure 6B:
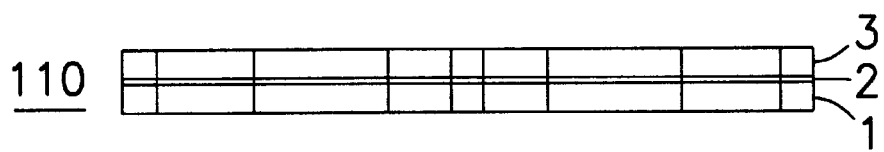
FIG. 6b is a side view of a three-layered subassembly of a ten-layered microwave, multilayer integrated circuit shown in FIG. 2.

With reference to FIG. 6, subassembly 110 is manufactured by bonding layers 1, 2, 3 together. Using the fusion bonding process described above, the top of layer 1 is bonded to the bottom of layer 2, and the top of layer 2 is bonded to the bottom of layer 3, as shown in FIG. 6b. Then, 27 holes 610 having diameters of approximately 0.019 inches are drilled into subassembly 110 as shown in FIG. 6a. Subassembly 110 is sodium etched. Subassembly 110 is cleaned by rinsing in alcohol for 15 to 30 minutes, then preferably rinsing in water, preferably deionized, having a temperature of 70 to 125 degrees F for at least 15 minutes. Subassembly 110 is then vacuum baked for approximately 30 minutes to 2 hours at approximately 90 to 180 degrees C, but preferably for one hour at 149 degrees C. Subassembly 110 is plated with copper, preferably first using an electroless method followed by an electrolytic method, to a thickness of approximately 0.0005 to 0.001 inches. Subassembly 110 is preferably rinsed in water, preferably deionized, for at least 1 minute. Subassembly 110 is heated to a temperature of approximately 90 to 125 degrees C for approximately 5 to 30 minutes, but preferably 90 degrees C for 5 minutes and then laminated with photoresist. A mask is used and the photoresist is developed using the proper exposure settings to create the pattern shown in FIG. 6a. The top side of subassembly 110 is copper etched. Subassembly 110 is cleaned by rinsing in alcohol for 15 to 30 minutes, then preferably rinsing in water, preferably deionized, having a temperature of 70 to 125 degrees F for at least 15 minutes. Subassembly 110 is then vacuum baked for approximately 30 minutes to 2 hours at approximately 90 to 180 degrees C, but preferably for one hour at 149 degrees C.

b. Layer 4

Figure 7B:
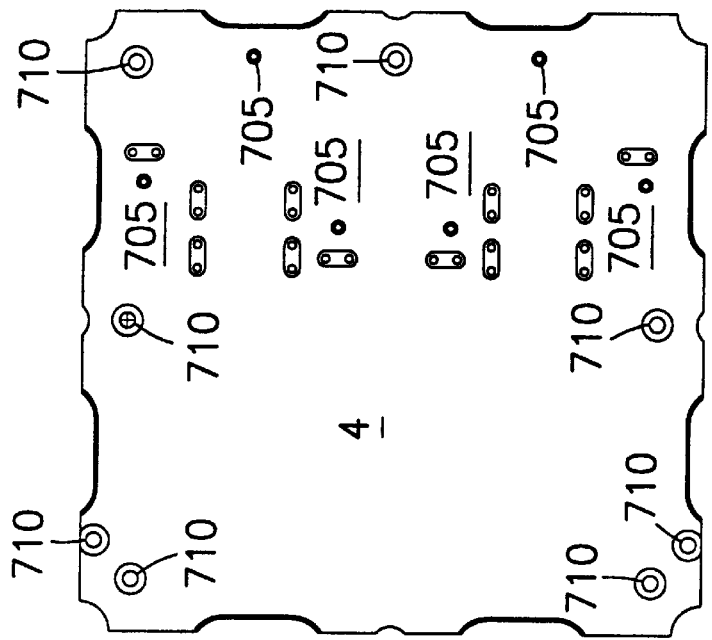
FIG. 7b is a bottom view of the unfinished fourth layer of a ten-layered microwave, multilayer integrated circuit shown in FIG. 2.
Figure 7C:
FIG. 7c is a side view of the unfinished fourth layer of a ten-layered microwave, multilayer integrated circuit shown in FIG. 2.
Figure 7A:
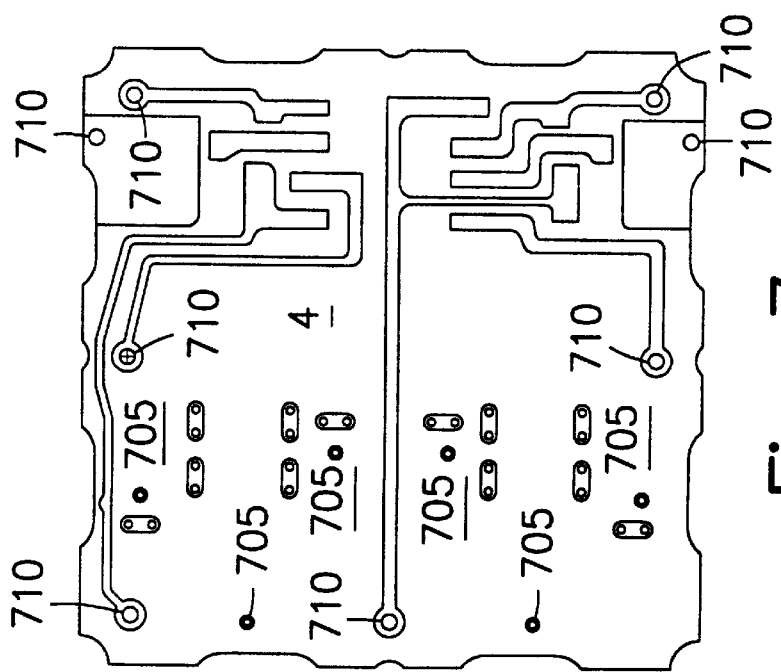
FIG. 7a is a top view of the unfinished fourth layer of a ten-layered microwave, multilayer integrated circuit shown in FIG. 2.

With reference to FIG. 7, a preferred embodiment of layer 4 is shown. First, thirty holes 705 having diameters of approximately 0.010 inches and eight holes 710 having diameters of 0.019 inches are drilled into layer 4, as shown in FIG. 7a. Next, layer 4 is sodium etched. Layer 4 is cleaned by rinsing in alcohol for 15 to 30 minutes, then preferably rinsing in water, preferably deionized, having a temperature of 70 to 125 degrees F for at least 15 minutes. Layer 4 is then vacuum baked for approximately 30 minutes to 2 hours at approximately 90 to 180 degrees C, but preferably for one hour at 149 degrees C. Layer 4 is plated with copper, preferably first using an electroless method followed by an electrolytic method, to a thickness of approximately 0.0005 to 0.001 inches. Layer 4 is preferably rinsed in water, preferably deionized, for at least 1 minute. Layer 4 is heated to a temperature of approximately 90 to 125 degrees C for approximately 5 to 30 minutes, but preferably 90 degrees C for 5 minutes, and then laminated with photoresist. Masks are used and the photoresist is developed using the proper exposure settings to create the pattern shown in FIGS. 7a and 7b. Both the top side and the bottom side of layer 4 are copper etched. Layer 4 is cleaned by rinsing in alcohol for 15 to 30 minutes, then preferably rinsing in water, preferably deionized, having a temperature of 70 to 125 degrees F for at least 15 minutes. Layer 4 is then vacuum baked for approximately 30 minutes to 2 hours at approximately 90 to 180 degrees C, but preferably for one hour at 149 degrees C.

C. Subassembly 120

Figure 8A:
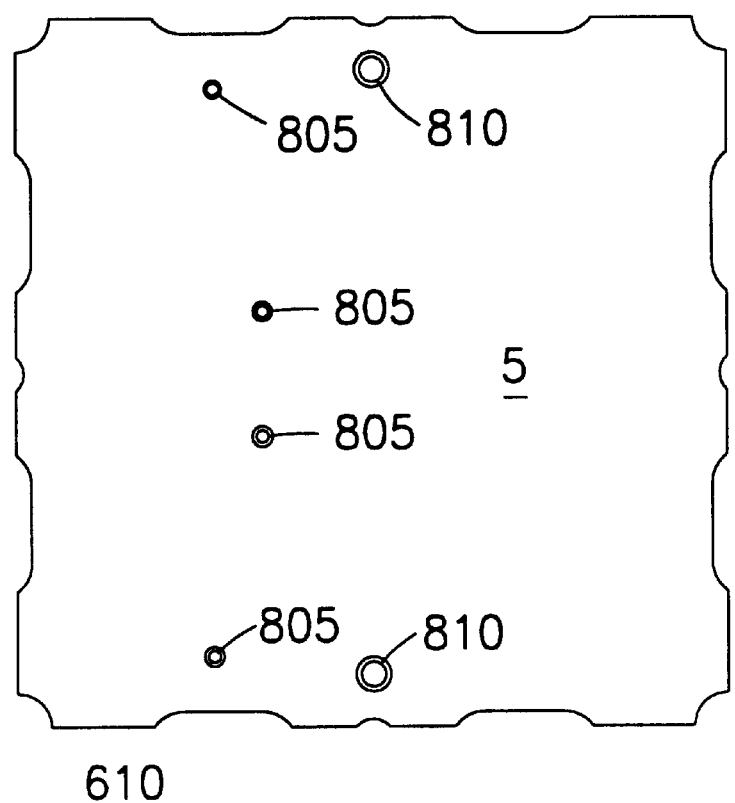
FIG. 8a is a top view of the unfinished fifth layer of a ten-layered microwave, multilayer integrated circuit shown in FIG. 2.
Figure 8B:
FIG. 8b is a side view of the unfinished fifth layer of a ten-layered microwave, multilayer integrated circuit shown in FIG. 2.

With reference to FIG. 8, a preferred embodiment of layer 5 is shown. First, four holes 805 having diameters of approximately 0.010 inches and two holes 810 having diameters of approximately 0.019 inches are drilled into layer 5, as shown in FIG. 8a. Next, layer 5 is sodium etched. Layer 5 is cleaned by rinsing in alcohol for 15 to 30 minutes, then preferably rinsing in water, preferably deionized, having a temperature of 70 to 125 degrees F for at least 15 minutes. Layer 5 is then vacuum baked for approximately 30 minutes to 2 hours at approximately 90 to 180 degrees C, but preferably for one hour at 149 degrees C. Layer 5 is plated with copper, preferably first using an electroless method followed by an electrolytic method, to a thickness of approximately 0.0005 to 0.001 inches. Layer 5 is preferably rinsed in water, preferably deionized, for at least 1 minute. Layer 5 is heated to a temperature of approximately 90 to 125 degrees C for approximately 5 to 30 minutes, but preferably 90 degrees C for 5 minutes, and then laminated with photoresist. A mask is used and the photoresist is developed using the proper exposure settings to create the pattern shown in FIG. 8a. The top side of layer 5 is copper etched. Layer 5 is cleaned by rinsing in alcohol for 15 to 30 minutes, then preferably rinsing in water, preferably deionized, having a temperature of 70 to 125 degrees F for at least 15 minutes. Layer 5 is then vacuum baked for approximately 30 minutes to 2 hours at approximately 90 to 180 degrees C, but preferably for one hour at 149 degrees C.

With reference to FIG. 9, a preferred embodiment of layer 6 is shown. First, six holes 905 having diameters of approximately 0.010 inches are drilled into layer 6, as shown in FIGS. 9a and 9b. Next, layer 6 is sodium etched. Layer 6 is cleaned by rinsing in alcohol for 15 to 30 minutes, then preferably rinsing in water, preferably deionized, having a temperature of 70 to 125 degrees F for at least 15 minutes. Layer 6 is then vacuum baked for approximately 30 minutes to 2 hours at approximately 90 to 180 degrees C, but preferably for one hour at 149 degrees C. Layer 6 is plated with copper, preferably first using an electroless method followed by an electrolytic method, to a thickness of approximately 0.0005 to 0.001 inches. Layer 6 is preferably rinsed in water, preferably deionized, for at least 1 minute. Layer 6 is heated to a temperature of approximately 90 to 125 degrees C for approximately 5 to 30 minutes, but preferably 90 degrees C for 5 minutes, and then laminated with photoresist. A mask is used and the photoresist is developed using the proper exposure settings to create the pattern shown in FIG. 9b. The bottom side of layer 6 is copper etched. Layer 6 is cleaned by rinsing in alcohol for 15 to 30 minutes, then preferably rinsing in water, preferably deionized, having a temperature of 70 to 125 degrees F for at least 15 minutes. Layer 6 is then vacuum baked for approximately 30 minutes to 2 hours at approximately 90 to 180 degrees C, but preferably for one hour at 149 degrees C.

With reference to FIG. 10, subassembly 120 is manufactured by bonding layers 5, 6 together. Using the fusion bonding process described above, the top of layer 5 is bonded to the bottom of layer 6, as shown in FIG. 10c. Then, 136 holes 1003 having diameters of approximately 0.008 inches and 18 holes 1005 having diameters of approximately 0.010 inches are drilled into subassembly 120 as shown in FIGS. 10a and 10b. Subassembly 120 is sodium etched. Subassembly 120 is cleaned by rinsing in alcohol for 15 to 30 minutes, then preferably rinsing in water, preferably deionized, having a temperature of 70 to 125 degrees F for at least 15 minutes. Subassembly 120 is then vacuum baked for approximately 30 minutes to 2 hours at approximately 90 to 180 degrees C, but preferably for one hour at 149 degrees C. Subassembly 120 is plated with copper, preferably first using an electroless method followed by an electrolytic method, to a thickness of approximately 0.0005 to 0.001 inches. Subassembly 120 is preferably rinsed in water, preferably deionized, for at least 1 minute. Subassembly 120 is heated to a temperature of approximately 90 to 125 degrees C for approximately 5 to 30 minutes, but preferably 90 degrees C for 5 minutes, and then laminated with photoresist. Masks are used and the photoresist is developed using the proper exposure settings to create the patterns shown in FIGS. 10a and 10b. The top side and bottom side of subassembly 120 is copper etched. Open cutouts 1050, 1060 are formed by milling in two places. Subassembly 120 is cleaned by rinsing in alcohol for 15 to 30 minutes, then preferably rinsing in water, preferably deionized, having a temperature of 70 to 125 degrees F for at least 15 minutes. Subassembly 120 is then vacuum baked for approximately 30 minutes to 2 hours at approximately 90 to 180 degrees C, but preferably for one hour at 149 degrees C.

d. Layer 7

Figure 11B:
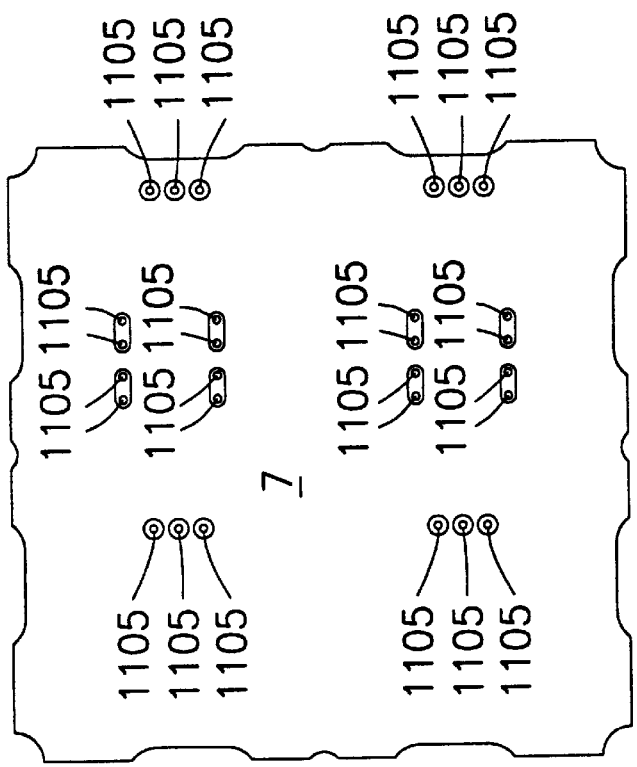
FIG. 11b is a bottom view of the unfinished seventh layer of a ten-layered microwave, multilayer integrated circuit shown in FIG. 2.
Figure 11C:
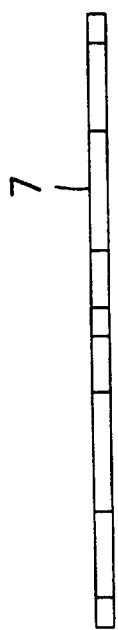
FIG. 11c is a side view of the unfinished seventh layer of a ten-layered microwave, multilayer integrated circuit shown in FIG. 2.
Figure 11A:
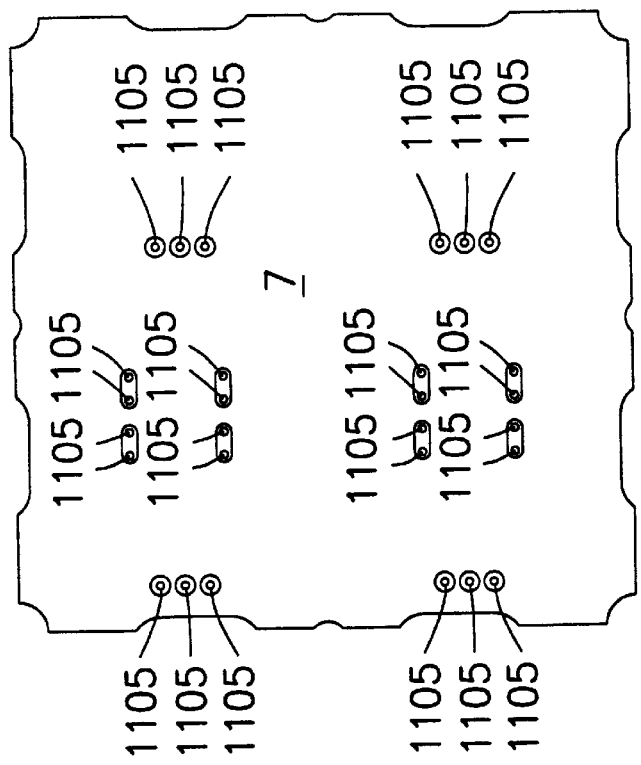
FIG. 11a is a top view of the unfinished seventh layer of a ten-layered microwave, multilayer integrated circuit shown in FIG. 2.

With reference to FIG. 11, a preferred embodiment of layer 7 is shown. First, 28 holes 1105 having diameters of approximately 0.010 inches are drilled into layer 7, as shown in FIGS. 11a and 11b. Next, layer 7 is sodium etched. Layer 7 is cleaned by rinsing in alcohol for 15 to 30 minutes, then preferably rinsing in water, preferably deionized, having a temperature of 70 to 125 degrees F for at least 15 minutes. Layer 7 is then vacuum baked for approximately 30 minutes to 2 hours at approximately 90 to 180 degrees C, but preferably for one hour at 149 degrees C. Layer 7 is plated with copper, preferably first using an electroless method followed by an electrolytic method, to a thickness of approximately 0.0005 to 0.001 inches. Layer 7 is preferably rinsed in water, preferably deionized, for at least 1 minute. Layer 7 is heated to a temperature of approximately 90 to 125 degrees C for approximately 5 to 30 minutes, but preferably 90 degrees C for 5 minutes, and then laminated with photoresist. Masks are used and the photoresist is developed using the proper exposure settings to create the patterns shown in FIGS. 11a and 11b. Both sides of layer 7 are copper etched. Layer 7 is cleaned by rinsing in alcohol for 15 to 30 minutes, then preferably rinsing in water, preferably deionized, having a temperature of 70 to 125 degrees F for at least 15 minutes. Layer 7 is then vacuum baked for approximately 30 minutes to 2 hours at approximately 90 to 180 degrees C, but preferably for one hour at 149 degrees C.

e. Subassembly 130

Figure 12A:
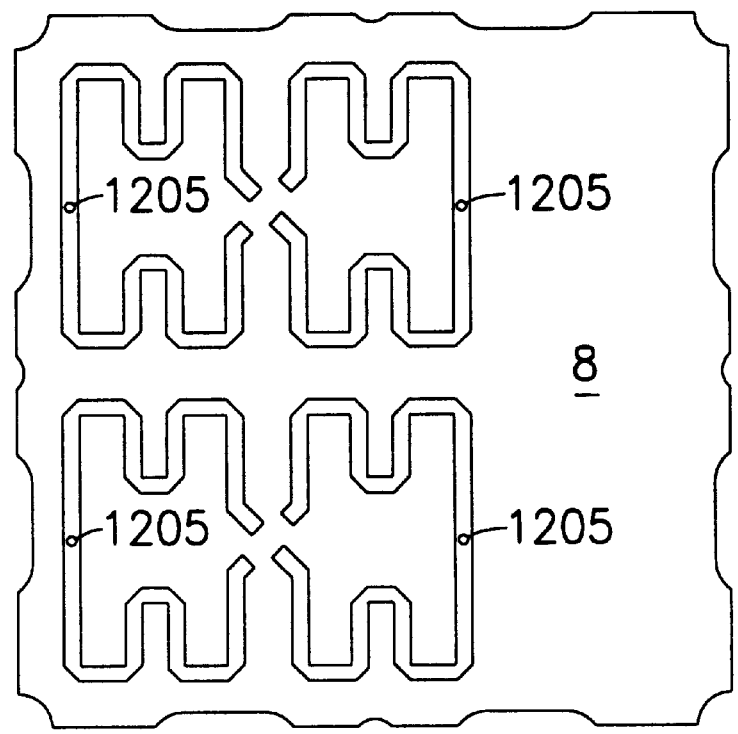
FIG. 12a is a top view of the unfinished eighth layer of a ten-layered microwave, multilayer integrated circuit shown in FIG. 2.
Figure 12B:
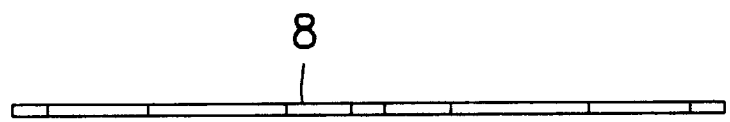
FIG. 12b is a side view of the unfinished eighth layer of a ten-layered microwave, multilayer integrated circuit shown in FIG. 2.

With reference to FIG. 12, a preferred embodiment of layer 8 is shown. First, four holes 1205 having diameters of approximately 0.010 inches are drilled into layer 8, as shown in FIG. 12a. Next, layer 8 is sodium etched. Layer 8 is cleaned by rinsing in alcohol for 15 to 30 minutes, then preferably rinsing in water, preferably deionized, having a temperature of 70 to 125 degrees F for at least 15 minutes. Layer 8 is then vacuum baked for approximately 30 minutes to 2 hours at approximately 90 to 180 degrees C, but preferably for one hour at 149 degrees C. Layer 8 is plated with copper, preferably first using an electroless method followed by an electrolytic method, to a thickness of approximately 0.0005 to 0.001 inches. Layer 8 is preferably rinsed in water, preferably deionized, for at least 1 minute. Layer 8 is heated to a temperature of approximately 90 to 125 degrees C for approximately 5 to 30 minutes, but preferably 90 degrees C for 5 minutes, and then laminated with photoresist. A mask is used and the photoresist is developed using the proper exposure settings to create the pattern shown in FIG. 12a. The top side of layer 8 is copper etched. Layer 8 is cleaned by rinsing in alcohol for 15 to 30 minutes, then preferably rinsing in water, preferably deionized, having a temperature of 70 to 125 degrees F for at least 15 minutes. Layer 8 is then vacuum baked for approximately 30 minutes to 2 hours at approximately 90 to 180 degrees C, but preferably for one hour at 149 degrees C.

Figure 13A:
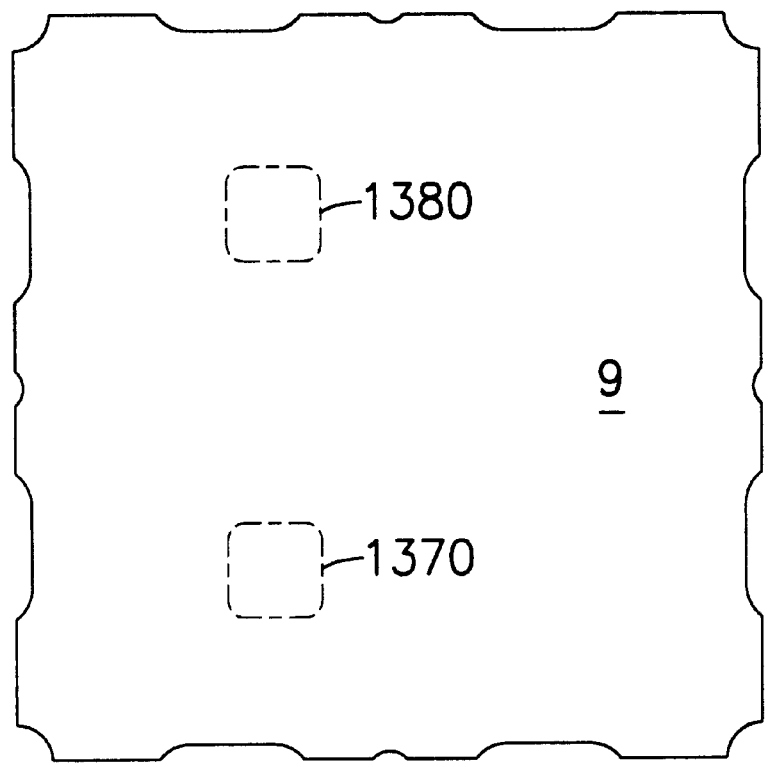
FIG. 13a is a top view of the unfinished ninth layer of a ten-layered microwave, multilayer integrated circuit shown in FIG. 2.
Figure 13B:
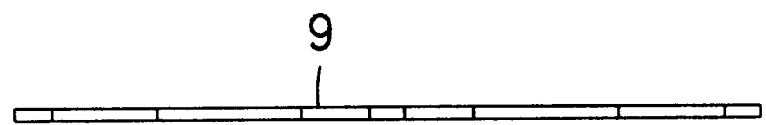
FIG. 13b is a side view of the unfinished ninth layer of a ten-layered microwave, multilayer integrated circuit shown in FIG. 2.

With reference to FIG. 13, a preferred embodiment of layer 9 is shown. Layer 9 is spotfaced 1370, 1380 (also sometimes referred to as "counterbored") as shown in FIG. 13a, to a depth of approximately 0.005 to 0.008 inches deep without breaking through the substrate. Layer 9 is sodium etched on the spotface (top) side. Layer 9 is cleaned by rinsing in alcohol for 15 to 30 minutes, then preferably rinsing in water, preferably deionized, having a temperature of 70 to 125 degrees F for at least 15 minutes. Layer 9 is then vacuum baked for approximately 30 minutes to 2 hours at approximately 90 to 180 degrees C, but preferably for one hour at 149 degrees C.

Figure 14B:
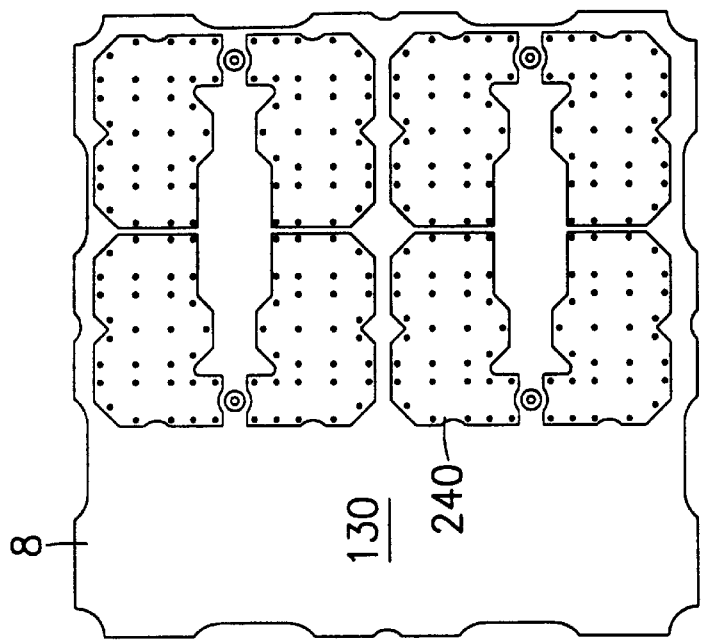
FIG. 14b is a bottom view of a second two-layered subassembly of a ten-layered microwave, multilayer integrated circuit shown in FIG. 2.
Figure 14C:
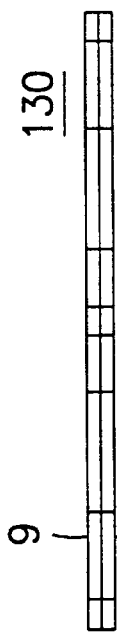
FIG. 14c is a side view of a second two-layered subassembly of a ten-layered microwave, multilayer integrated circuit shown in FIG. 2.
Figure 14A:
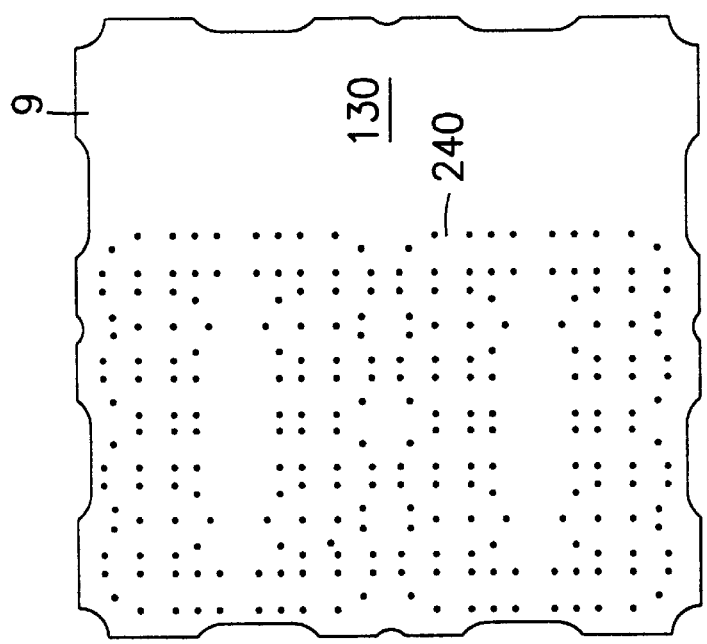
FIG. 14a is a top view of a second two-layered subassembly of a ten-layered microwave, multilayer integrated circuit shown in FIG. 2.

With reference to FIG. 14, subassembly 130 is manufactured by bonding layers 8, 9 together. Using the fusion bonding process described above, the top of layer 8 is bonded to the bottom of layer 9, as shown in FIG. 14c. Then, 240 holes 1403 having diameters of approximately 0.008 inches are drilled into the top of subassembly 130 as shown in FIGS. 14a and 14b. Subassembly 130 is sodium etched. Subassembly 130 is cleaned by rinsing in alcohol for 15 to 30 minutes, then preferably rinsing in water, preferably deionized, having a temperature of 70 to 125 degrees F for at least 15 minutes. Subassembly 130 is then vacuum baked for approximately 30 minutes to 2 hours at approximately 90 to 180 degrees C, but preferably for one hour at 149 degrees C. Subassembly 130 is plated with copper, preferably first using an electroless method followed by an electrolytic method, to a thickness of approximately 0.0005 to 0.001 inches. Subassembly 130 is preferably rinsed in water, preferably deionized, for at least 1 minute. Subassembly 130 is heated to a temperature of approximately 90 to 125 degrees C for approximately 5 to 30 minutes, but preferably 90 degrees C for 5 minutes and then laminated with photoresist. A mask is used and the photoresist is developed using the proper exposure settings to create the pattern shown in FIG. 14b. The bottom side of subassembly 130 is etched. Subassembly 130 is cleaned by rinsing in alcohol for 15 to 30 minutes, then preferably rinsing in water, preferably deionized, having a temperature of 70 to 125 degrees F for at least 15 minutes. Subassembly 130 is then vacuum baked for approximately 30 minutes to 2 hours at approximately 90 to 180 degrees C, but preferably for one hour at 149 degrees C.

f. Subassembly 140

Figure 15A:
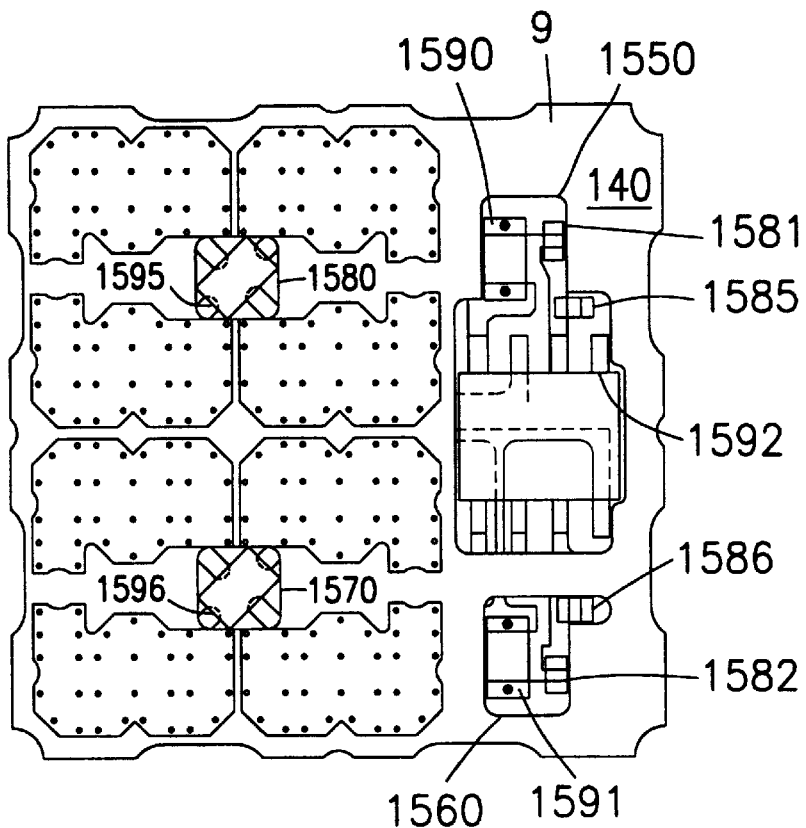
FIG. 15a is a top view of a nine-layered subassembly of a ten-layered microwave, multilayer integrated circuit shown in FIG. 2.
Figure 15B:
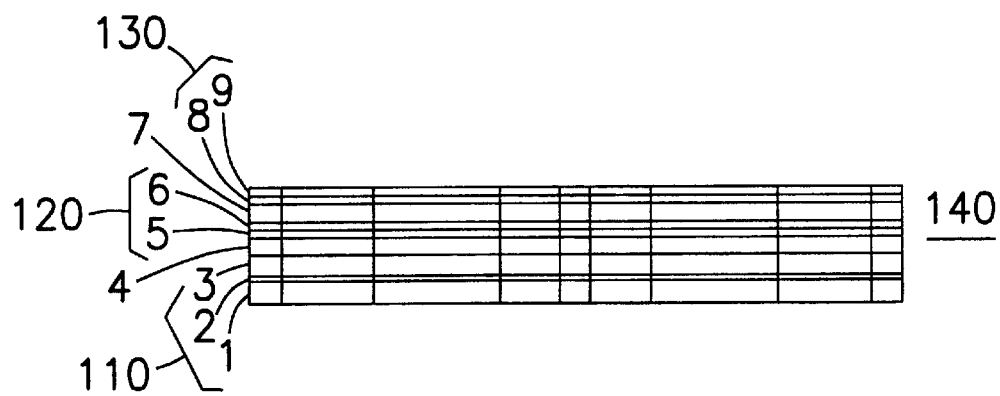
FIG. 15b is a side view of a nine-layered subassembly of a ten-layered microwave, multilayer integrated circuit shown in FIG. 2.

With reference to FIG. 15, subassembly 140 is manufactured by bonding subassembly 110, layer 4, subassembly 120, layer 7, subassembly 130 together. Using the fusion bonding process described above, the top of subassembly 110 is bonded to the bottom of layer 4, the top of layer 4 is bonded to the bottom of subassembly 120, the top of subassembly 120 is bonded to the bottom of layer 7, and the top of layer 7 is bonded to the bottom of subassembly 130, as shown in FIG. 15b. Subassembly 130 is heated to a temperature of approximately 90 to 125 degrees C for approximately 5 to 30 minutes, but preferably 90 degrees C for 5 minutes and then laminated with photoresist. A mask is used and the photoresist is developed using the proper exposure settings to create the pattern shown in FIG. 15a. The top side of subassembly 130 is copper etched. Subassembly 130 is cleaned by rinsing in alcohol for 15 to 30 minutes, then preferably rinsing in water, preferably deionized, having a temperature of 70 to 125 degrees F for at least 15 minutes. Open cutouts 1550, 1560, 1570, 1580 are formed by milling in four places. In a preferred embodiment, 50 Ohm resistors 1581, 1582, 130 Ohm resistors 1585, 1586, 0.68 uF capacitors 1590, 1591, P/N CLC 416 amplifier 1592, and diode rings 1595, 1596 are installed using solder paste, such as $Sn_{96}AgO_4$ solder paste.

Subassembly 140 is cleaned by rinsing in alcohol for 15 minutes, then rinsing in deionized water having a temperature of 70 degrees F for 15 minutes. Subassembly 140 is then vacuum baked for approximately 45 to 90 minutes at approximately 90 to 125 degrees C, but preferably for one hour at 100 degrees C.

g. Layer 10

Figure 16A:
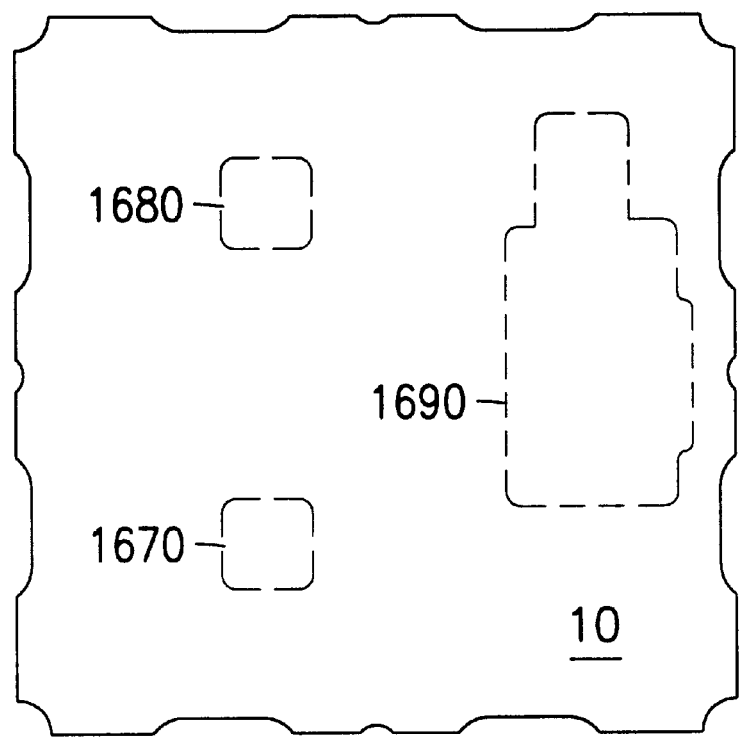
FIG. 16a is a top view of the unfinished tenth layer of a ten-layered microwave, multilayer integrated circuit shown in FIG. 2.
Figure 16B:
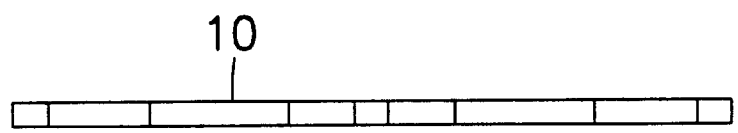
FIG. 16b is a side view of the unfinished tenth layer of a ten-layered microwave, multilayer integrated circuit shown in FIG. 2.

With reference to FIG. 16, a preferred embodiment of layer 10 is shown. Layer 10 is spotfaced 1670, 1680, 1690 as shown in FIG. 16a, to a depth of approximately 0.020 inches deep without breaking through the substrate. Layer 10 is sodium etched on the spotface (top) side. Layer 10 is cleaned by rinsing in alcohol for 15 to 30 minutes, then preferably rinsing in water, preferably deionized, having a temperature of 70 to 125 degrees F for at least 15 minutes. Layer 10 is then vacuum baked for approximately 30 minutes to 2 hours at approximately 90 to 180 degrees C, but preferably for one hour at 149 degrees C.

h. Bonding Film 150

Figure 17A:
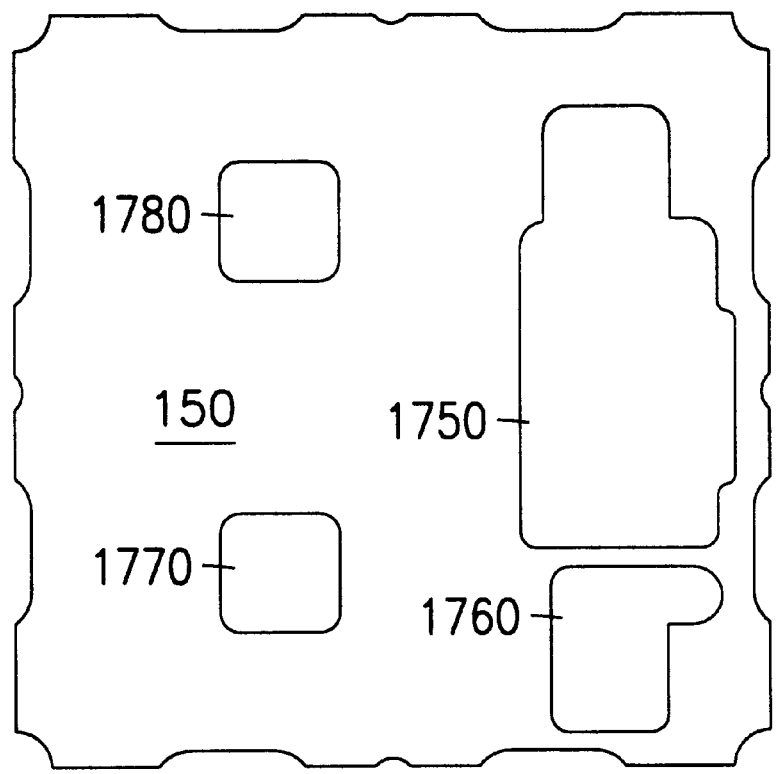
FIG. 17a is a top view of a bonding film for a ten-layered microwave, multilayer integrated circuit shown in FIG. 2.
Figure 17B:
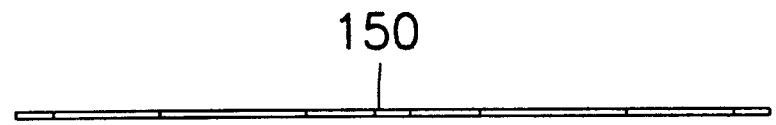
FIG. 17b is a side view of a bonding film for a ten-layered microwave, multilayer integrated circuit shown in FIG. 2.

With reference to FIG. 17, a preferred embodiment of bonding film 150 is shown. Open cutouts 1750, 1760, 1770, 1780 are formed by milling in four places, as shown in FIG. 17a. In a preferred embodiment, bonding film 150 is a thermoset polymer bonding film approximately 0.0015 inches thick that is cured according to the profile: 300 PSI, with a 30-minute ramp from room temperature to 180 degrees C, a 65-minute dwell at 180 degrees C, and a 30-minute ramp to 35 degrees C. Alternatively, bonding film 150 is cured according to the profile: 300 PSI, with a 15-minute ramp from room temperature to 105 degrees C, a 10-minute ramp to 180 degrees C, a 65-minute dwell at 180 degrees C, and a 22-minute ramp to 35 degrees C. In an alternative preferred embodiment, bonding film 150 is a thermoplastic polymer bonding film approximately 0.0015 inches thick that is cured according to the profile of 200 PSI, with a 30-minute ramp from room temperature to 150 degrees C, a 50-minute dwell at 150 degrees C, and a 30-minute ramp to 35 degrees C. Other types of bonding film may be used, and the manufacturer's specifications for bonding are typically followed.

i. Multilayer Structure 200

With reference to FIG. 2, multilayer structure 200 is manufactured by bonding subassembly 140 and layer 100 together, according to the relevant curing profile. The top of subassembly 140 is bonded, using bonding film 150, to the bottom of layer 10. Then, eight slots 250 are milled into multilayer structure 200 as shown in FIGS. 2a and 2b. Multilayer structure 200 is sodium etched. Multilayer structure 200 is cleaned by rinsing in alcohol for 15 to 30 minutes, then preferably rinsing in water, preferably deionized, having a temperature of 70 to 125 degrees F for at least 15 minutes. Multilayer structure 200 is then vacuum baked for approximately 30 minutes to 2 hours at approximately 90 to 180 degrees C, but preferably for one hour at 100 degrees C. Multilayer structure 200 is plated with copper, preferably first using an electroless method followed by an electrolytic method, to a thickness of approximately 0.0005 to 0.001 inches. Multilayer structure 200 is preferably rinsed in water, preferably deionized, for at least 1 minute. Multilayer structure 200 is heated to a temperature of approximately 90 to 125 degrees C for approximately 5 to 30 minutes, but preferably 90 degrees C for 5 minutes, and then laminated with photoresist. A mask is used and the photoresist is developed using the proper exposure settings to create the pattern shown in FIG. 2b. The bottom side of multilayer structure 200 is copper etched. Multilayer structure 200 is cleaned by rinsing in alcohol for 15 to 30 minutes, then preferably rinsing in water, preferably deionized, having a temperature of 70 to 125 degrees F for at least 15 minutes. Multilayer structure 200 is plated with tin or lead, then the tin/lead plating is heated to the melting point to allow excess plating to reflow into a solder alloy. Multilayer structure 200 is again cleaned by rinsing in alcohol for 15 to 30 minutes, then preferably rinsing in water, preferably deionized, having a temperature of 70 to 125 degrees F for at least 15 minutes. Four corner holes 260 and four edge holes 270 having radii of approximately 0.039 inches are drilled into multilayer structure 200. Multilayer structure 200 is de-paneled using a depaneling method, which may include drilling and milling, diamond saw, and/or EXCIMER laser. Multilayer structure 200 is again cleaned by rinsing in alcohol for 15 to 30 minutes, then preferably rinsing in water, preferably deionized, having a temperature of 70 to 125 degrees F for at least 15 minutes. Multilayer structure 200 is then vacuum baked for approximately 45 to 90 minutes at approximately 90 to 125 degrees C, but preferably for one hour at 100 degrees C.

XIII. Other Embodiments

It is to be appreciated that one of ordinary skill in the art may manufacture various circuits based upon the process disclosed above. For example, different circuits may be incorporated in a multilayer structure, and the number of layers used may be varied. One of ordinary skill in the art may also alter the manufacturing process in an obvious manner (for example, drilling a different number of holes, using different masks, adding different devices).

Additionally, while there have been shown and described and pointed out fundamental novel features of the invention as applied to embodiments thereof, it will be understood that various omissions and substitutions and changes in the form and details of the invention, as herein disclosed, may be made by those skilled in the art without departing from the spirit of the invention. It is expressly intended that all combinations of those elements and/or method steps which perform substantially the same function in substantially the same way to achieve the same results are within the scope of the invention. It is the intention, therefore, to be limited only as indicated by the scope of the claims appended hereto.

What is claimed is:

1. A process for manufacturing a homogeneous dielectric subassembly having at least one embedded active semiconductor device, comprising the steps of:

manufacturing a plurality of layers comprising fluoropolymer composite substrates;

forming a cutout in at least one of said plurality of layers;

fusion bonding, after said forming a cutout, said at least one of said plurality of layers to another at least one of said plurality of layers, wherein said cutout leaves at least a portion of metalization disposed between said at least one of said plurality of layers and said another at least one of said plurality of layers exposed;

drilling through fluoropolymer composite substrate material to create a passage to said cutout, wherein said cutout is completely encased by fluoropolymer composite substrate material prior to said drilling; and attaching said at least one active semiconductor device to said metalization after said fusion bonding thereby forming said homogeneous dielectric subassembly having at least one embedded active semiconductor device.

2. A process for manufacturing a multilayer structure comprising the process for manufacturing a homogeneous dielectric subassembly of claim 1 and comprising the step of covering said at least one embedded active semiconductor device without damaging said at least one active semiconductor device.

3. The process for manufacturing a multilayer structure of claim 2, wherein said covering said at least one embedded active semiconductor device comprises bonding at least one covering layer to said homogeneous dielectric subassembly.

4. The process for manufacturing a multilayer structure of claim 3, wherein said bonding at least one covering layer to said homogeneous dielectric subassembly utilizes bonding film.

5. The process for manufacturing a homogeneous dielectric subassembly of claim 1, wherein at least two of said plurality of layers are connected by plated via holes.

* * * * *